United States Patent
Swanson

(10) Patent No.: US 10,803,914 B1
(45) Date of Patent: Oct. 13, 2020

(54) SELECTIVELY SQUELCHING DIFFERENTIAL STROBE INPUT SIGNAL IN MEMORY-DEVICE TESTING SYSTEM

(71) Applicant: Micron Technology, Inc., Boise, ID (US)

(72) Inventor: Joel Scott Swanson, East Bethel, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/551,853

(22) Filed: Aug. 27, 2019

(51) Int. Cl.
  *G11C 7/22* (2006.01)
  *H03G 3/34* (2006.01)
  *G11C 29/12* (2006.01)
  *G11C 7/10* (2006.01)

(52) U.S. Cl.
  CPC ............ *G11C 7/222* (2013.01); *G11C 7/1006* (2013.01); *G11C 29/1201* (2013.01); *H03G 3/34* (2013.01)

(58) Field of Classification Search
  CPC .......... G11C 8/18; G11C 7/222; G11C 7/1066
  See application file for complete search history.

(56) References Cited

U.S. PATENT DOCUMENTS

| | | | |
|---|---|---|---|
| 2011/0063931 A1* | 3/2011 | Linam | G06F 13/1689 365/193 |
| 2016/0049183 A1* | 2/2016 | Bose | G06N 20/00 365/193 |

\* cited by examiner

*Primary Examiner* — Han Yang
(74) *Attorney, Agent, or Firm* — Schwegman Lundberg & Woessner, P.A.

(57) ABSTRACT

In an embodiment, a differential strobe input squelch circuit includes a squelch sub-circuit that is configured to perform operations including receiving a true strobe signal, a complement strobe signal, and a strobe difference signal that is representative of a difference between the true strobe signal and the complement strobe signal; determining, based on the true strobe signal and the complement strobe signal, whether the strobe difference signal is defined or undefined; and outputting a modified strobe difference signal that is equal to the strobe difference signal when the squelch sub-circuit determines that the strobe difference signal is defined and that is instead equal to a constant strobe-level voltage when the squelch sub-circuit determines that the strobe difference signal is undefined.

20 Claims, 10 Drawing Sheets

SELECTIVELY SQUELCHING DIFFERENTIAL STROBE INPUT SIGNAL IN MEMORY-DEVICE TESTING SYSTEM

TECHNICAL FIELD

Embodiments of the disclosure relate generally to memory-device testing systems and more specifically to selectively squelching a differential strobe input signal in a memory-device testing system.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components. A memory-device testing system (e.g., a memory-device testing chip) can be utilized to test memory devices, which could be designated for installation in a memory sub-system, among other possibilities.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
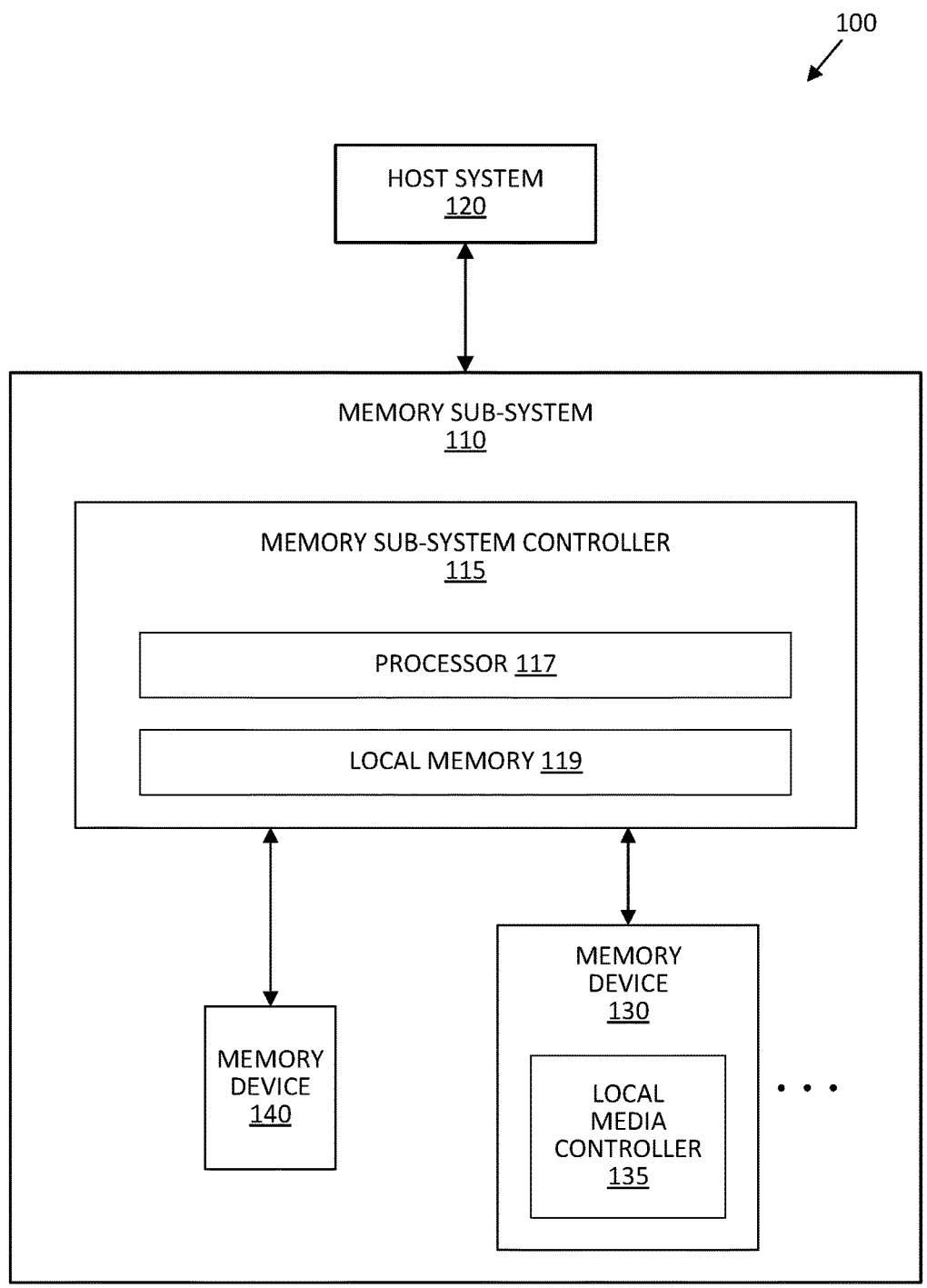
FIG. 1 illustrates an example computing environment that includes a memory sub-system that, in turn, includes one or more memory devices that are of a type that can be tested by a memory-device testing system in accordance with some embodiments of the present disclosure.

Aspects of the present disclosure are directed to selectively squelching a differential strobe input signal in a memory-device testing system. In at least one example, a memory-device testing system—that includes a differential strobe input squelch circuit in accordance with the present disclosure—is used to test a memory device that is designated for use in, e.g., a memory sub-system. In other examples, the device under test (DUT) is designated for another use. A memory sub-system can be a storage device, a memory module, or a hybrid of a storage device and a memory module. Examples of storage devices and memory modules are described below in conjunction with FIG. 1. In general, a host system can utilize a memory sub-system that includes one or more memory components (also referred herein to as "memory devices"). The host system can provide data to be stored at the memory sub-system and can request data to be retrieved from the memory sub-system.

A memory sub-system can further include a memory sub-system controller that can communicate with each of the memory components to perform operations such as reading data, writing data, erasing data, and/or the like at the memory components, perhaps in response to requests received from a host system. Furthermore, one or more of the memory components can include a local media controller to manage the memory cells of the memory component, communicate with the memory sub-system controller on behalf of the memory component, and execute memory requests (e.g., read requests, write requests, and/or the like) that are received from the memory sub-system controller, among other functions. The memory components can include non-volatile memory components such as negative-and-(NAND)-type flash memory. The memory components can include volatile memory components such as random access memory (RAM).

In a typical arrangement in which a memory-device testing system is being used to test a memory device, the memory-device testing system and the memory device are communicatively connected with one another such that data signals and what are known as strobe signals can be exchanged between the two. When testing a write operation to the memory device, the memory-device testing system generates a single-ended data signal and a strobe signal, and transmits both to the memory device. When testing a read operation from the memory device, the memory device generates a single-ended data signal and a strobe signal, and transmits both to the memory-device testing system.

In many instances, the strobe signal is a differential strobe signal, which includes a true strobe signal and a complement strobe signal. In general, though not at all times, the complement strobe signal is the inverse of the true strobe signal. Whichever device—the memory device or the memory-device testing system—is receiving data at a given moment uses the received differential strobe signal to capture the transmitted data from the received single-ended data signal that is being simultaneously received. From the perspective of that receiving device, the inbound data signal can be referred to as a data input signal, and the inbound differential strobe signal can be referred to as a differential strobe input signal.

In typical implementations, when testing the reading of data from the memory device, the memory-device testing system makes use of a preamble pulse signal that is generated from a free-running clock on the memory-device testing system independently of the data input signal and the differential strobe input signal being generated and transmitted by the memory device. The preamble pulse signal, which is also referred to simply as the preamble pulse, is used to bracket incoming strobe pulses when the memory-device testing system is in read mode and instead to gate (e.g., mask or block) input/output (I/O) signals when the memory-device testing system is in write mode.

In a typical scenario, a memory-device testing system is in write mode when the preamble pulse is low, which causes the memory-device testing system to responsively block the capture of data by transmitting a constant voltage level (e.g., a logical high) to a data-capture circuit, which is the component of the memory-device testing system that is configured to capture data from the data input signal when the memory-device testing system is in read mode. Conversely, the memory-device testing system is in read mode when the preamble pulse is high, which causes the memory-device testing system to responsively enable the capture of data by transmitting, to the data-capture circuit, what is referred to herein as a strobe difference signal, which is a signal that is generated on the memory-device testing system and that is representative of the changing difference between the true strobe input and the complement strobe input. In the case of double data rate (DDR) memory, the data-capture circuit captures data from the data input signal on each rising edge and on each falling edge of the strobe difference signal.

In current implementations of memory-device testing systems, errors in reading data from a memory device frequently occur when the preamble pulse is high, such that the memory-device testing system is in read mode, at the same time that the strobe difference signal is undefined (e.g., in an incoherent state that is also known as a high-impedance state), which occurs when the true strobe signal and the complement strobe signal have the same value (e.g., either both low or both high). As such, it is important in current implementations of memory-device testing systems to maintain precise timing between the preamble pulse and the strobe difference signal.

In particular, to avoid data-read errors in current implementations, just prior to beginning a given instance of reading data, the preamble pulse needs to transition from low to high within a relatively narrow time window that does not start until the strobe difference signal transitions from being undefined to being defined. Similarly, just after a given instance of reading data, the preamble pulse needs to transition from high to low within a relatively narrow time window between the completion of the data being read and the strobe difference signal transitioning from being defined to being undefined. These narrow time windows are typically on the order of a single unit interval (UI) or perhaps two UIs.

Achieving the proper transitions of the preamble pulse within the proper narrow time windows becomes more difficult as the clock rates of the clocks that are used to generate the relevant signals increase, such as when these clock rates approach values in the range of 4-5 gigahertz (GHz) and beyond. It is noted that, in a typical arrangement, both (i) the clock that is used on the memory-device testing system to generate the preamble pulse and (ii) the clock that is used on the memory device to generate the single-ended data signal and differential strobe signal operate at the same clock rate as one another. In the case of DDR memory, the operating data transfer rate is double the clock rate.

Moreover, when using a memory-device testing system to test the reading of data from a memory device, it is typical for tests to be conducted at a number of different values of testing parameters such as temperature, supply voltage, loading, and the like, to stress the memory device and thereby identify potential weaknesses. As these testing parameters and/or others are varied, shifts often occur in the relative timing between the preamble pulse and the differential strobe input signal (and therefore the strobe difference signal that is derived therefrom). These shifts in relative timing make even more difficult the already difficult task of maintaining precise timing between the preamble pulse and the strobe difference signal.

Thus, both high clock rates and the relative timing shifts caused by the variance of testing parameters make it quite difficult in current implementations of memory-device testing systems to achieve proper precise timing between the preamble pulse signal, which is generated on the memory-device testing system, and the strobe difference signal, which is derived from the differential strobe input that is generated on the memory device. Failure to achieve this proper precise timing often results in the occurrence of data-read errors even in connection with memory devices that are not defective, but that are designated as such due to these timing issues. As such, current implementations of memory-device testing systems result in too many false negatives with respect to tested memory devices.

Aspects of the present disclosure address the above and other deficiencies by selectively squelching a differential strobe input signal in a memory-device testing system. In accordance with at least one embodiment, a memory-device testing system includes a differential strobe input squelch circuit that itself includes a tester strobe receiver circuit, a squelch sub-circuit, and a strobe-gate circuit. The tester strobe receiver circuit includes three receivers: a first receiver that modifies the true strobe input from the DUT by subtracting a reference voltage therefrom, a second receiver that modifies the complement strobe input from the DUT by subtracting the same reference voltage therefrom, and a third receiver that generates the strobe difference signal by subtracting the DUT complement strobe signal from the DUT true strobe input.

In at least one implementation, the squelch sub-circuit receives the modified true strobe input, the modified complement strobe input, and the strobe difference signal from the tester strobe receiver circuit. Moreover, the squelch sub-circuit outputs a modified strobe difference signal to the strobe-gate circuit. When the modified true strobe input and the modified complement strobe input are equal (e.g., both low, determined by way of example by a logical NOR gate), this indicates that the strobe difference signal is undefined, and the squelch sub-circuit therefore "squelches" the undefined strobe difference signal by setting the modified strobe difference signal equal to what is referred to herein as a constant strobe-level voltage (e.g., a logical high). When, however, the modified true strobe input and modified complement strobe input are not equal, this indicates that the strobe difference signal is defined, and the squelch sub-circuit therefore does not squelch the defined strobe difference signal, and instead lets that defined strobe difference signal pass through by setting the modified strobe difference signal—that the squelch sub-circuit outputs to the strobe-gate circuit—equal to the defined strobe difference signal.

The strobe gate circuit may receive the modified strobe difference signal—set by the squelch sub-circuit to either the constant strobe-level voltage or the defined strobe difference signal—from the squelch sub-circuit, and output what is referred to herein as a strobe clock signal to the above-mentioned data-capture circuit of the memory-device testing system. The strobe-gate circuit is controlled by the preamble pulse. When the preamble pulse is low, the strobe-gate circuit sets the strobe clock signal equal to the above-mentioned constant strobe-level voltage (e.g., logical high). When, however, the preamble pulse is high, the strobe-gate circuit sets the strobe clock signal equal to the modified strobe difference signal (which itself is equal at different times as described herein to either the constant strobe-level voltage (when the strobe difference signal is undefined) or the (defined) strobe difference signal).

Thus, in at least one implementation of the present disclosure, a memory-device testing system includes a differential strobe input squelch circuit that receives a differential strobe from a memory device (or other DUT) and generates a strobe difference signal that is representative of the difference between the true strobe input and the complement strobe input. Moreover, the differential strobe input squelch circuit outputs that strobe difference signal to a data-capture circuit of the memory-device testing system when that strobe difference signal is defined and the preamble pulse is high, and otherwise outputs a constant strobe-level voltage to the data-capture circuit. Moreover, in at least one implementation, the memory-device testing system generates a preamble pulse that goes high earlier and stays high later in a given read cycle as compared with current implementations.

Among the benefits of the present disclosure are that the data-capture circuit will never receive an undefined strobe difference signal, which occurs in current implementations and causes false negatives when testing memory devices. Moreover, implementations of the present disclosure improve the timing margin between the memory device and the memory-device testing system, making the above-described proper timing much more readily achievable as compared with current implementations of memory-device testing systems.

Indeed, in accordance with implementations of the present disclosure, using the beginning of a read mode as an example, the preamble pulse can go high while the strobe difference signal is still undefined, and the preamble pulse can remain high and simply be waiting for the strobe difference signal to become defined, at which point the strobe difference signal will be passed through to the data-capture circuit. In other instances, however, the preamble pulse can still be low at the moment the strobe difference signal transitions from being undefined to being defined, and the preamble pulse can go high after that transition, at which point the constant strobe-level voltage will be replaced at the data-capture circuit with the then-passed-through (and defined) strobe difference signal. Thus, it can be seen that the tolerance with respect to when the preamble pulse can validly transition from low to high is wider in connection with implementations of the present disclosure as compared with current implementations of memory-device testing systems.

Thus, implementations of the present disclosure significantly reduce the difficulty in maintaining proper timing between the differential strobe input that is generated on the memory device and the preamble pulse that is generated from a free-running clock on the memory-device testing system. Accordingly, fewer data errors occur in connection with non-defective memory devices, improving yield numbers with respect to the production of memory devices.

FIG. 1 illustrates an example computing environment 100 that includes a memory sub-system 110 that, in turn, includes one or more memory devices 130 that are of a type that can be tested by a memory-device testing system in accordance with some embodiments of the present disclosure. The memory sub-system 110 can include media, such as one or more volatile memory devices (e.g., memory device 140), one or more non-volatile memory devices (e.g., memory device 130), or a combination of such. In some implementations of the present disclosure, a DUT that is described below in connection with FIG. 2 could be a memory device such as the memory device 130. In other implementations, the DUT could be a different type of memory device.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by a PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, RAM, such as dynamic random access memory (DRAM) and synchronous dynamic random access memory (SDRAM).

An example of non-volatile memory devices (e.g., memory device 130) includes NAND-type flash memory. Each of the memory devices 130 can include one or more arrays of memory cells such as single level cells (SLCs) or multi-level cells (MLCs) (e.g., triple level cells (TLCs) or quad-level cells (QLCs)). In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages or memory blocks that can refer to a unit of the memory component used to store data.

Although non-volatile memory components such as NAND-type flash memory are described, the memory device 130 can be based on any other type of non-volatile memory, such as read-only memory (ROM), phase change memory (PCM), magneto RAM (MRAM), negative-or (NOR) flash memory, erasable programmable ROM (EPROM), electrically erasable programmable ROM (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or another suitable processor.

Furthermore, in some implementations, the memory sub-system controller 115 includes a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include ROM for storing micro-code. While the example memory sub-system 110 in FIG. 1 is illustrated as including the memory sub-system controller 115, in another embodiment of the present disclosure, a memory sub-system 110 may not include a memory sub-system controller, and may instead rely upon external control (e.g., provided by an external host, or by a processor or controller separate from the memory sub-system 110).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130.

Figure 2:
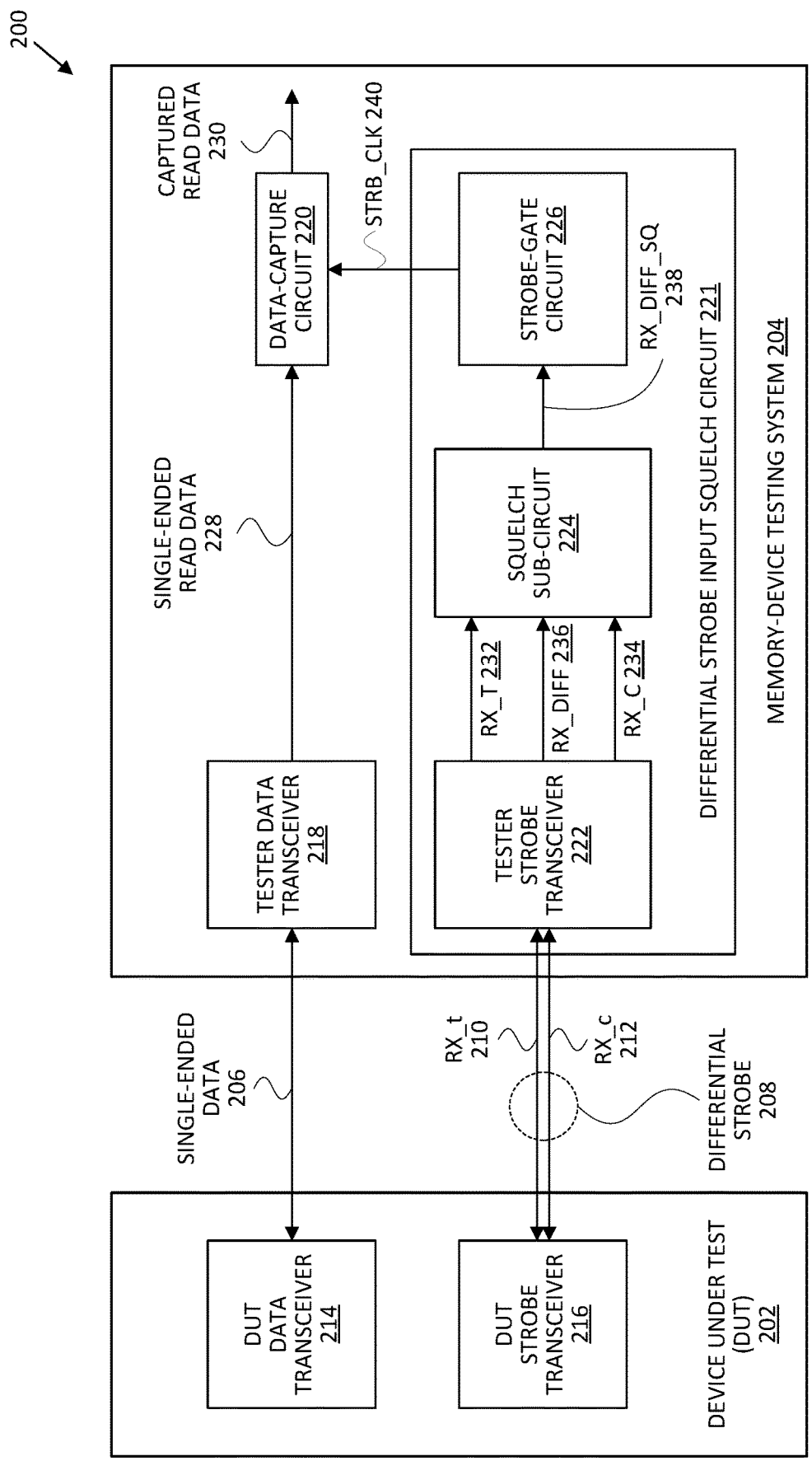
FIG. 2 is a block diagram of an example memory-device testing environment that includes an example memory-device testing system for testing an example memory device in accordance with some embodiments of the present disclosure.

FIG. 2 is a block diagram of an example memory-device testing environment 200 that includes an example memory-device testing system 204 for testing an example DUT 202, which could be a memory device of the same type as the memory device 130. The DUT 202 could be a type of low-power DDR (LPDDR) memory known as LPDDR5, which is often used in certain low-power implementations such as mobile devices, and which is also known as mobile DDR (MDDR). The DUT 202 could be a different type of memory device, such as a different type of DDR such as DDR1, DDR2, DDR3, or DDR4, among other possibilities. DDR memory was standardized by JEDEC under JESD79 and provides source-synchronous data capture at a rate of twice the clock rate.

As depicted, a single-ended data signal 206 and a differential strobe 208 are exchanged between the DUT 202 and the memory-device testing system 204. During write operations from the memory-device testing system 204 to the DUT 202, it is the memory-device testing system 204 that generates the single-ended data signal 206 and the differential strobe 208. During read operations, which are the primary focus of the present disclosure, it is the DUT 202 that generates the single-ended data signal 206 and the differential strobe 208. As shown, the differential strobe 208 includes a DUT true strobe signal 210 (labeled "RX_t 210" in the drawings), and a DUT complement strobe signal 212 (labeled "RX_c 212" in the drawings). In some implementations of the present disclosure, the single-ended data signal 206 and the differential strobe 208 (including the DUT true strobe signal 210 and the DUT complement strobe signal 212) operate at frequencies on the order of 4-5 GHz. There could also be other control lines, address lines, and/or the like communicatively connecting the DUT 202 and the memory-device testing system 204.

In the described and depicted embodiment, the DUT 202 includes a DUT data transceiver 214 and a DUT strobe transceiver 216. The DUT data transceiver 214 is used by the DUT 202 to receive the single-ended data signal 206 from the memory-device testing system 204 during write operations to the DUT 202 and to transmit the single-ended data signal 206 to the memory-device testing system 204 during read operations from the DUT 202. The DUT strobe transceiver 216 is used by the DUT 202 to receive the differential strobe 208 from the memory-device testing system 204 during write operations to the DUT 202 and to transmit the differential strobe 208 to the memory-device testing system 204 during read operations from the DUT 202.

The memory-device testing system 204, including the herein-described components thereof, can be implemented on a single chip, sometimes referred to as a tester chip. In other implementations, the memory-device testing system 204 is implemented using a combination of multiple chips or other components on a common circuit board. In some instances, the memory-device testing system 204 is implemented using multiple circuit boards. Other arrangements are possible as well, as deemed suitable in various different contexts by those of skill in the art having the benefit of this disclosure.

In the described and depicted embodiment, the memory-device testing system 204 includes a tester data transceiver 218, a data-capture circuit 220, and a differential strobe input squelch circuit 221. The tester data transceiver 218 is used by the memory-device testing system 204 to transmit the single-ended data signal 206 to the DUT 202 during write operations to the DUT 202 and to receive the single-ended data signal 206 from the DUT 202 during read operations from the DUT 202. Moreover, the tester data transceiver 218 passes the single-ended data signal 206 through to the data-capture circuit 220 as the single-ended read data signal 228.

When the memory-device testing system 204 is in read mode, the memory-device testing system 204 uses the data-capture circuit 220 to capture the captured read data signal 230 from the single-ended read data signal 228. The data-capture circuit 220 does so by using the strobe clock signal 240 (labeled "STRB_CLK 240" in the drawings), which, during read mode at times when the strobe difference signal 236 is defined and the preamble pulse that is generated on the memory-device testing system 204 is high, is equal to the strobe difference signal 236. In some implementations, the data-capture circuit 220 captures data on both the rising edges and the falling edges of the strobe clock signal 240 at times when the strobe clock signal 240 is equal to the strobe difference signal 236. As can be seen from the below-described timing diagrams, in at least one implementation, the rising edges correspond to a rising DUT true strobe signal 210 crossing (e.g., temporarily equaling) a falling DUT complement strobe signal 212, whereas the falling edges correspond to a falling DUT true strobe signal 210 crossing (e.g., temporarily equaling) a rising DUT complement strobe signal 212.

In some embodiments, the data-capture circuit 220 is or includes a deserializer that receives serial data in and outputs parallel data, perhaps in instances in which the circuits in the core or whatever device or entity is receiving the read data operates at a lower data rate than that of the DUT 202. In some embodiments, the data-capture circuit 220 is or includes a gated D latch.

Moreover, the differential strobe input squelch circuit 221 includes a tester strobe transceiver 222, a squelch sub-circuit 224, and a strobe-gate circuit 226. The tester strobe transceiver 222 is used by the memory-device testing system 204 to transmit the differential strobe 208 to the DUT 202 during write operations to the DUT 202 and to receive the differential strobe 208 from the DUT 202 during read operations from the DUT 202. The tester strobe transceiver 222 transmits a modified true strobe signal 232 (labeled "RX_T 232" in the drawings), a modified complement strobe signal 234 (labeled "RX_C 234" in the drawings), and a strobe difference signal 236 (labeled "RX_DIFF 236" in the drawings) to the squelch sub-circuit 224.

The squelch sub-circuit 224 receives the modified true strobe signal 232, the modified complement strobe signal 234, and the strobe difference signal 236 and outputs a modified strobe difference signal 238 (labeled "RX_DIFF_SQ 238" in the drawings) to the strobe-gate circuit 226. The strobe-gate circuit 226 receives the modified strobe difference signal 238 from the squelch sub-circuit 224 and outputs a strobe clock signal 240 to the data-capture circuit 220. Certain illustrative internal components and associated functionality of the tester strobe transceiver 222, the squelch sub-circuit 224, and the strobe-gate circuit 226 are discussed more fully below in connection with at least FIG. 3.

Figure 3:
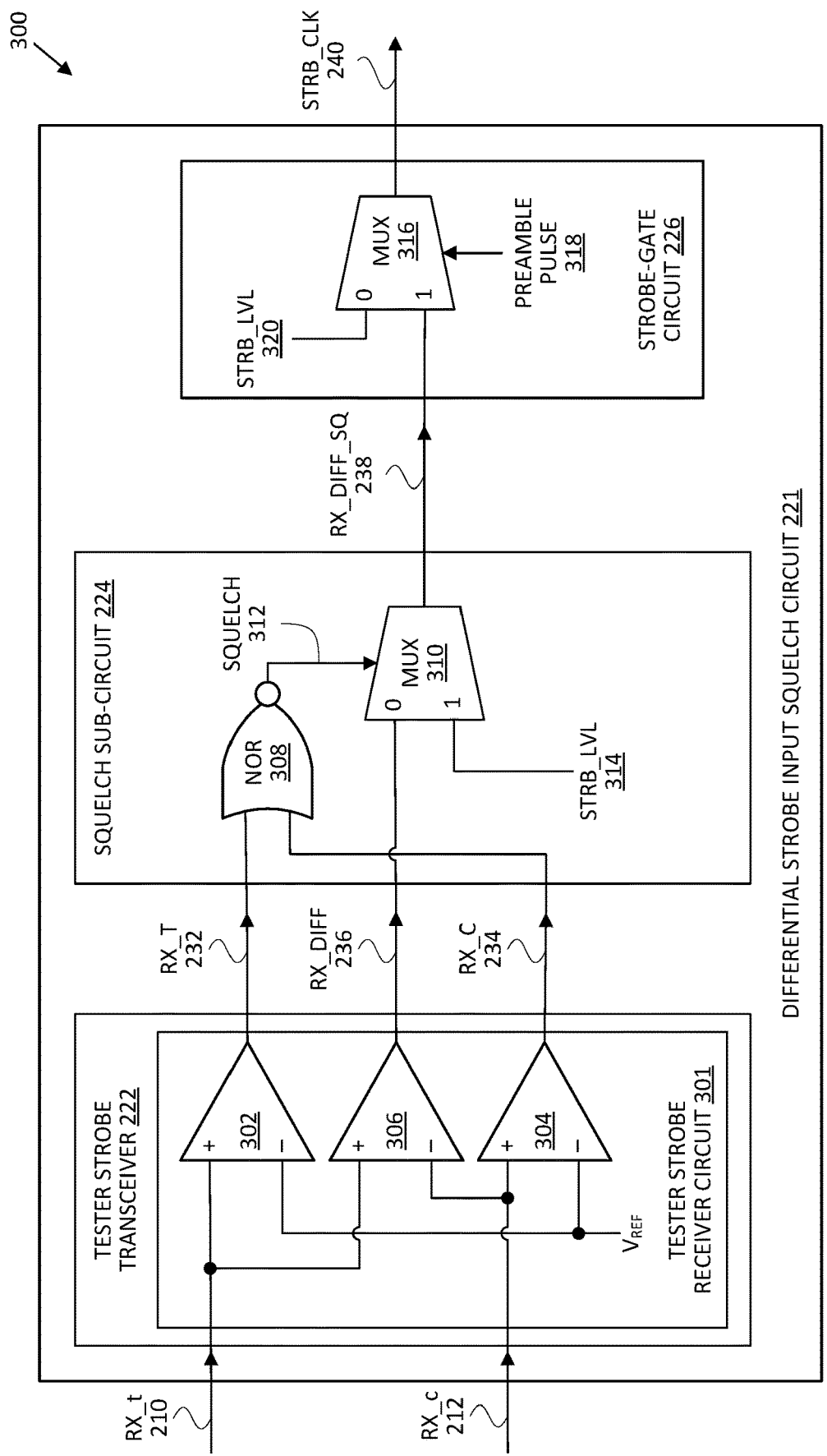
FIG. 3 is a circuit diagram that includes an example differential strobe input squelch circuit of the memory-device testing system of FIG. 2 in accordance with some embodiments of the present disclosure.

FIG. 3 is a circuit diagram 300 that depicts certain illustrative components of the differential strobe input squelch circuit 221. As described above, and as depicted in FIG. 3, the differential strobe input squelch circuit 221 includes the tester strobe transceiver 222, the squelch sub-circuit 224, and the strobe-gate circuit 226.

The tester strobe transceiver 222 includes a tester strobe receiver circuit 301, which receives and processes the DUT true strobe signal 210 and the DUT complement strobe signal 212 as described herein. The tester strobe transceiver 222 also includes additional components and connections that are not pictured and that are related to the transmission of the differential strobe 208 to the DUT 202 during write operations to the DUT 202. The tester strobe receiver circuit 301 includes a true-strobe receiver 302, a complement-strobe receiver 304, and a strobe-difference receiver 306. In an embodiment, each of the true-strobe receiver 302, the complement-strobe receiver 304, and the strobe-difference receiver 306 is implemented using a comparator that receives a first signal at the "+" input and a second signal at the "−" input and outputs a difference signal that is representative of the difference between the first signal and the second signal.

The true-strobe receiver 302 receives the DUT true strobe signal 210 at its "+" input and a reference voltage ($V_{REF}$) at its "−" input, and outputs the modified true strobe signal 232, which represents the difference between the DUT true strobe signal 210 and $V_{REF}$, to the squelch sub-circuit 224. In at least one implementation, the $V_{REF}$ is set equal to half of the supply voltage (often abbreviated $V_{DD}$) of the memory-device testing system 204. In some cases, the supply voltage is equal to 2.5 volts (V) and the reference voltage is equal to 1.25 V. In at least one implementation, the $V_{REF}$ represents the common mode of the DUT true strobe signal 210 and the DUT complement strobe signal 212.

The complement-strobe receiver 304 receives the DUT complement strobe signal 212 at its "+" input and $V_{REF}$ at its "−" input, and outputs the modified complement strobe signal 234, which represents the difference between the DUT complement strobe signal 212 and $V_{REF}$, to the squelch sub-circuit 224. The strobe-difference receiver 306 receives the DUT true strobe signal 210 at its "+" input and the DUT complement strobe signal 212 at its "−" input, and outputs the strobe difference signal 236, which represents the difference between the DUT true strobe signal 210 and the DUT complement strobe signal 212, to the squelch sub-circuit 224.

Because both the true-strobe receiver 302 and the complement-strobe receiver 304 receive a constant voltage ($V_{REF}$) at their "−" input, the true-strobe receiver 302 and the complement-strobe receiver 304 may be referred to as being single-ended receivers. And because the strobe-difference receiver 306 receives different time-varying signals—the DUT true strobe signal 210 and the DUT complement strobe signal 212—at its "+" and "−" inputs, the strobe-difference receiver 306 may be referred to as a true differential receiver. These labels do not necessarily indicate differences in the actual components, however, but rather are descriptions of the signals that the receivers take as inputs. As such, in at least one implementation of the present disclosure, the same type of receiver (e.g., comparator) is used to implement each of the true-strobe receiver 302, the complement-strobe receiver 304, and the strobe-difference receiver 306.

In the implementation that is depicted in and described in connection with FIG. 3, the squelch sub-circuit 224 includes a NOR function 308 (e.g., a NOR gate) and a multiplexer 310. The NOR function 308 is a 2-input NOR function that takes as its inputs the modified true strobe signal 232 and the modified complement strobe signal 234. The output of the NOR function 308 is a squelch signal 312 (labeled "SQUELCH 312" in the drawings). As is known in the art, a 2-input NOR function output is high (logical 1) only when both of its inputs are low (logical 0). As such, the squelch signal 312 is high only when both the modified true strobe signal 232 and the modified complement strobe signal 234 are low, and at all other times the squelch signal 312 is low.

The embodiments that are primarily described herein, including the implementation that is depicted in and described in connection with FIG. 3, implement what is known as ground-terminated I/O. Other implementations implement what is known as supply-terminated I/O. In supply-terminated-I/O implementations, the NOR function 308 is replaced by an AND function (e.g., an AND gate) that sets the squelch signal 312 high (logical 1) only when both the modified true strobe signal 232 and the modified complement strobe signal 234 are high (logical 1), and otherwise sets the squelch signal 312 low (logical 0).

The reason for this is that, in supply-terminated-I/O implementations, the strobe difference signal 236 is undefined only in instances in which both the modified true strobe signal 232 and the modified complement strobe signal 234 are high whereas, in the primarily described ground-terminated-I/O implementations, the strobe difference signal 236 is undefined only when both the modified true strobe signal 232 and the modified complement strobe signal 234 are low. Importantly, in both NOR-function and AND-function implementations, the logic is equivalent in the sense that the squelch signal 312 is high (logical 1) only when the strobe difference signal 236 is undefined, and is otherwise low (logical 0).

Moreover, both NOR-function and AND-function implementations are reliable in that, because both the modified true strobe signal 232 and the modified complement strobe signal 234 represent the difference between a time-varying input signal and $V_{REF}$, the modified true strobe signal 232 and the modified complement strobe signal 234 are each always defined. That is, each of the modified true strobe signal 232 and the modified complement strobe signal 234 is defined in both I/O states: the driven state and the high-impedance state. The driven state occurs when the DUT true strobe signal 210 and the DUT complement strobe signal 212 are not simultaneously at the same logic level, while the high-impedance state occurs when the DUT true strobe signal 210 and the DUT complement strobe signal 212 are simultaneously at the same logic level (either both high or both low). It is noted that the high-impedance state is another way of labeling the state in which the strobe difference signal 236 is undefined.

Returning now to describing ground-terminated-I/O implementations, the NOR function 308 is therefore the mechanism in at least some implementations by which the squelch sub-circuit 224 determines whether the strobe difference signal 236 is defined or undefined. When the modified true strobe signal 232 and the modified complement strobe signal 234 are equal (e.g., both low), the NOR function 308 sets the squelch signal 312 high, and otherwise the NOR function 308 sets the squelch signal 312 low.

The multiplexer 310 is a 2-data-input multiplexer that takes as its two data inputs the strobe difference signal 236 and a constant strobe-level voltage 314. The output of the multiplexer 310 is the modified strobe difference signal 238. The multiplexer 310 takes as its control input the squelch signal 312. Thus, when the squelch signal 312 is low, the multiplexer 310 sets the modified strobe difference signal 238 equal to the strobe difference signal 236, whereas, when the squelch signal 312 is high, the multiplexer 310 sets the modified strobe difference signal 238 equal to the constant strobe-level voltage 314. It is noted that, in this example implementation, the constant strobe-level voltage 314 is set to a logical high, though in other implementations the constant strobe-level voltage 314 could instead be set to a logical low.

By the combined operation of the NOR function 308 and the multiplexer 310, the squelch sub-circuit 224 sets the modified strobe difference signal 238 equal to the strobe difference signal 236 when the strobe difference signal 236 is defined, and instead sets the modified strobe difference signal 238 equal to the constant strobe-level voltage 314 when the strobe difference signal 236 is undefined. As stated, the squelch sub-circuit 224 outputs the modified strobe difference signal 238 to the strobe-gate circuit 226.

The strobe-gate circuit 226 includes a multiplexer 316, which is a 2-data-input multiplexer that takes as its two data inputs a constant strobe-level voltage 320 and the modified strobe difference signal 238. The output of the multiplexer 316 is the strobe clock signal 240, which, as described in connection with FIG. 2, is received and used by the data-capture circuit 220 to capture the captured read data signal 230 from the single-ended read data signal 228 when the memory-device testing system 204 is in read mode Similar to the constant strobe-level voltage 314, the constant strobe-level voltage 320 could be set to either a logical high or low, but is set to a logical high in this described implementation. In some implementations, the "1" input of the multiplexer 310 and the "0" input of the multiplexer 316 could both be connected to a common constant-voltage source.

The multiplexer 316 takes as its control input a preamble pulse 318 (labeled "PREAMBLE 318" or "PREAMBLE PULSE 318" in the drawings), which is a signal that is generated on the memory-device testing system 204 from a free-running clock, and that is independent of the generation of the DUT true strobe signal 210 and the DUT complement strobe signal 212 on the DUT 202. In this described implementation, the multiplexer 316 sets the strobe clock signal 240 equal to the constant strobe-level voltage 320 when the preamble pulse 318 is low and instead sets the strobe clock signal 240 equal to the modified strobe difference signal 238 when the preamble pulse 318 is high. In some embodiments, this logic could be reversed.

It is noted that the modified strobe difference signal 238 itself, even when selected by the multiplexer 316 to be passed through as the strobe clock signal 240, is at certain times equal to the strobe difference signal 236 and is at other times equal to the constant strobe-level voltage 314, depending on whether or not the strobe difference signal 236 is defined. Thus, taken together, the tester strobe receiver circuit 301, the squelch sub-circuit 224, and the strobe-gate circuit 226 cooperate to cause the differential strobe input squelch circuit 221 to set the strobe clock signal 240 equal to the strobe difference signal 236 only when it is both true that the strobe difference signal 236 is defined and the preamble pulse 318 is high, and to otherwise set the strobe clock signal 240 equal to the constant strobe-level voltage 314, 320.

Figure 4:
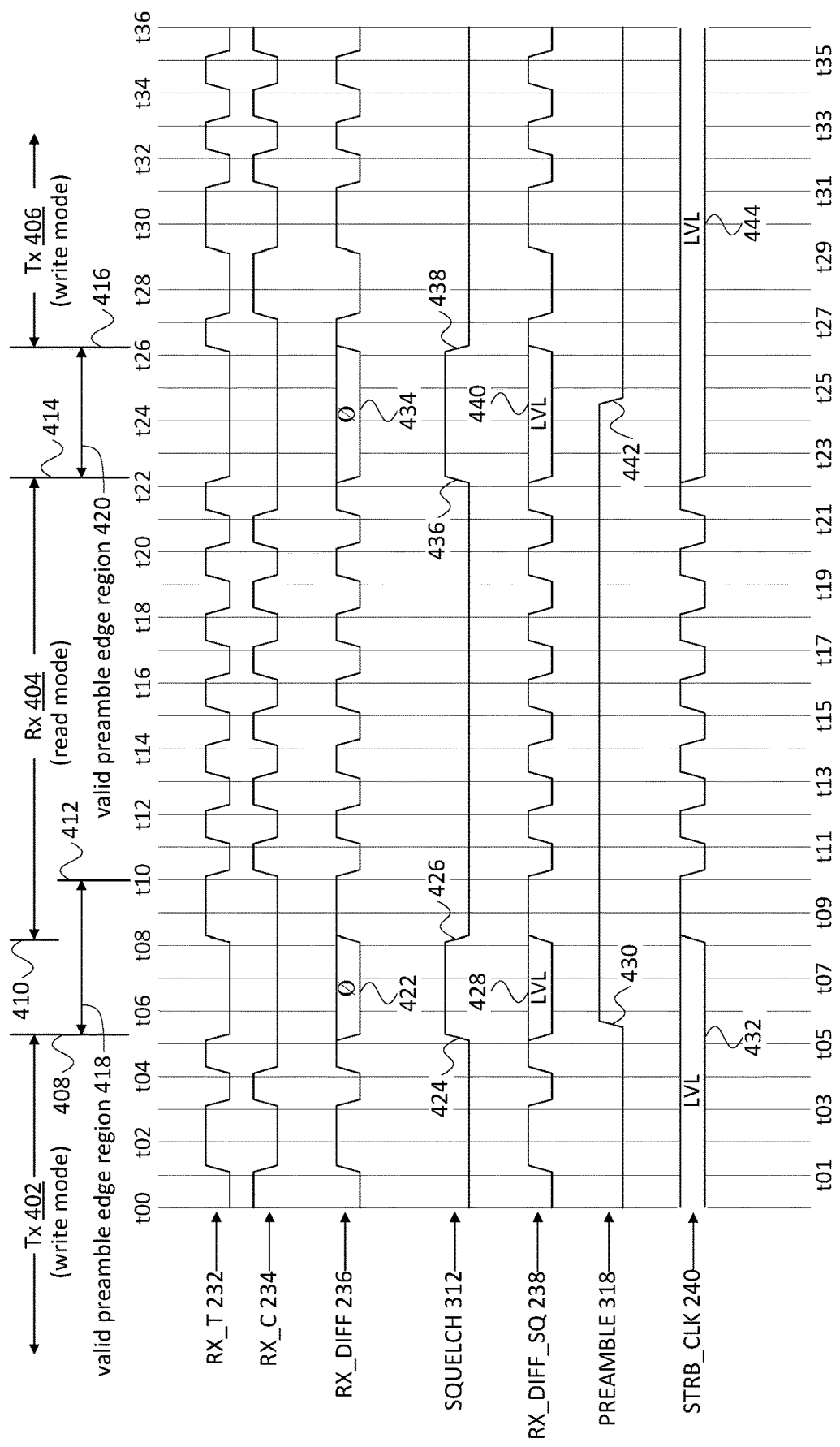
FIG. 4 is a first example timing diagram depicting example digital logic signals received and transmitted by various components that are depicted in the circuit diagram of FIG. 3 in accordance with some embodiments of the present disclosure.

FIG. 4 is a timing diagram 400 that depicts an example of a number of the herein-described digital logic signals that are generated and received by various components described herein. The timing diagram 400 is presented by way of illustration and example and not limitation. Furthermore, no specific voltage levels or amounts of time are indicated in the timing diagram 400. In the timing diagram 400, each of the parallel vertical lines represents a moment in time (labeled t00 through t36) and, as such, 36 consecutive time intervals are depicted: t00-t01, t01402, and so forth. Moreover, the even-numbered times t00, t02, t04, . . . , t36 are labeled at the top of the corresponding vertical lines whereas the odd-numbered times t01, t03, t05, . . . , t35 are labeled at the bottom of the corresponding vertical lines.

The overall time period that is depicted in the timing diagram 400 is divided as shown at the top into a write mode 402, a read mode 404, and a write mode 406. The write mode 402 has already begun prior to time t00, and ends at a time 408 that occurs between the time t05 and the time t06. The read mode 404 spans from a time 410 through a time 414, and the write mode 406 starts at a time 416 and continues past the time t36. It is noted that the various times that are numbered in the 400 series can but need not align precisely with times that are labeled t00-t36.

It can be seen in the timing diagram 400 that the modified complement strobe signal 234 is usually though not always equal to the logical inverse of the modified true strobe signal 232. Moreover, it can also be seen that the strobe difference signal 236 is equal to the difference between the modified true strobe signal 232 and the modified complement strobe signal 234. Moreover, during time periods in which both the modified true strobe signal 232 and the modified complement strobe signal 234 are low, the strobe difference signal 236 is undefined, as shown by an undefined segment 422 of the strobe difference signal 236 and an undefined segment 434 of the strobe difference signal 236.

Furthermore, in the timing diagram 400, the squelch signal 312 is low at all times other than during the times that the strobe difference signal 236 is undefined. In other words, the squelch signal 312 is high only during the undefined segment 422 and the undefined segment 434 of the strobe difference signal 236. The beginning of the undefined segment 422 of the strobe difference signal 236 corresponds to a rising edge 424 of the squelch signal 312, and the end of the undefined segment 422 corresponds with a falling edge 426 of the squelch signal 312. Similarly, the undefined segment 434 of the strobe difference signal 236 corresponds with the time between a rising edge 436 and a falling edge 438 of the squelch signal 312.

At the same time as the undefined segment 422 of the strobe difference signal 236 (between the rising edge 424 and the falling edge 426 of the squelch signal 312), the modified strobe difference signal 238 is set, at 428, equal to the constant strobe-level voltage 314. Similarly, at the same time as the undefined segment 434 of the strobe difference signal 236 (between the rising edge 436 and the falling edge 438 of the squelch signal 312), the modified strobe difference signal 238 is set, at 440, equal to the constant strobe-level voltage 314. At all other times that are depicted in the timing diagram 400, the modified strobe difference signal 238 is set equal to the strobe difference signal 236.

The preamble pulse 318 starts out low (during the write mode 402), and then transitions to high at a rising edge 430, which occurs between the time t05 and the time t06. The rising edge 430 also occurs between the time 408 and a time 412, where the period between the time 408 and the time 412 is referred to in the timing diagram 400 as a valid preamble edge region 418. The valid preamble edge region 418 therefore starts as the write mode 402 ends and extends until the time 412, which corresponds with the time t10 at which the modified true strobe signal 232 and the modified complement strobe signal 234 begin a strobe pattern that is used by the data-capture circuit 220 to capture the captured read data signal 230 from the single-ended read data signal 228.

Thus, in accordance with the described embodiment, the valid preamble edge region 418 spans approximately t05410. In current implementations, however, the valid preamble edge region 418 would still end at t10 (the time 412), to enable the data-capture circuit 220 to start capturing data when the modified true strobe signal 232 and the modified complement strobe signal 234 begin the above-mentioned strobe pattern, but would not start until after t08 when the undefined segment 422 of the strobe difference signal 236 ends. Thus, in the depicted embodiment, the present disclosure achieves the valid preamble edge region 418 being approximately 7 IUs greater than it is in prior implementations, where the time period between each pair of successive vertical lines in the timing diagram 400 represents 2 IUs in a DDR implementation.

The preamble pulse remains high until it transitions to low at the falling edge 442, which occurs between the times t24 and t25 during what is labeled a valid preamble edge region 420, which spans from the time 414 (just after t22) to the time 416 (just after t26), a span of approximately 8 IUs. The valid preamble edge region 420 begins in the depicted embodiment when the undefined segment 434 of the strobe difference signal 236 begins and ends when the write mode 406 begins. In current implementations, though not shown in this manner in the timing diagram 400, the valid preamble edge region 420 could actually begin—the preamble pulse 318 could transition from high to low without causing data-read errors—before the undefined segment 434 of the strobe difference signal 236 begins. In prior implementations, the valid preamble edge region 420 has to begin and end before the undefined segment 434 of the strobe difference signal 236 even begins.

Finally, it can be seen in the timing diagram 400 that the strobe clock signal 240 is only equal to the strobe difference signal 236 at times 432 and 444 when both the strobe difference signal 236 is defined and the preamble pulse 318 is high, and is equal to the constant strobe-level voltage 314, 320 at all other times. As such, the strobe clock signal 240 is never equal to the strobe difference signal 236 when the strobe difference signal 236 is undefined (e.g., during either the undefined segment 422 or the undefined segment 434). In accordance with implementations of the present disclosure, the preamble pulse 318 can transition from low to high during the undefined segment 422 of the strobe difference signal 236 without causing data-read errors at the data-capture circuit 220 because the squelch signal 312 prevents the undefined strobe difference signal 236 from being passed through as the modified strobe difference signal 238. This is not required, however, as the valid preamble edge region 418 also extends past the end of the undefined segment 422 of the strobe difference signal 236.

Figure 5:
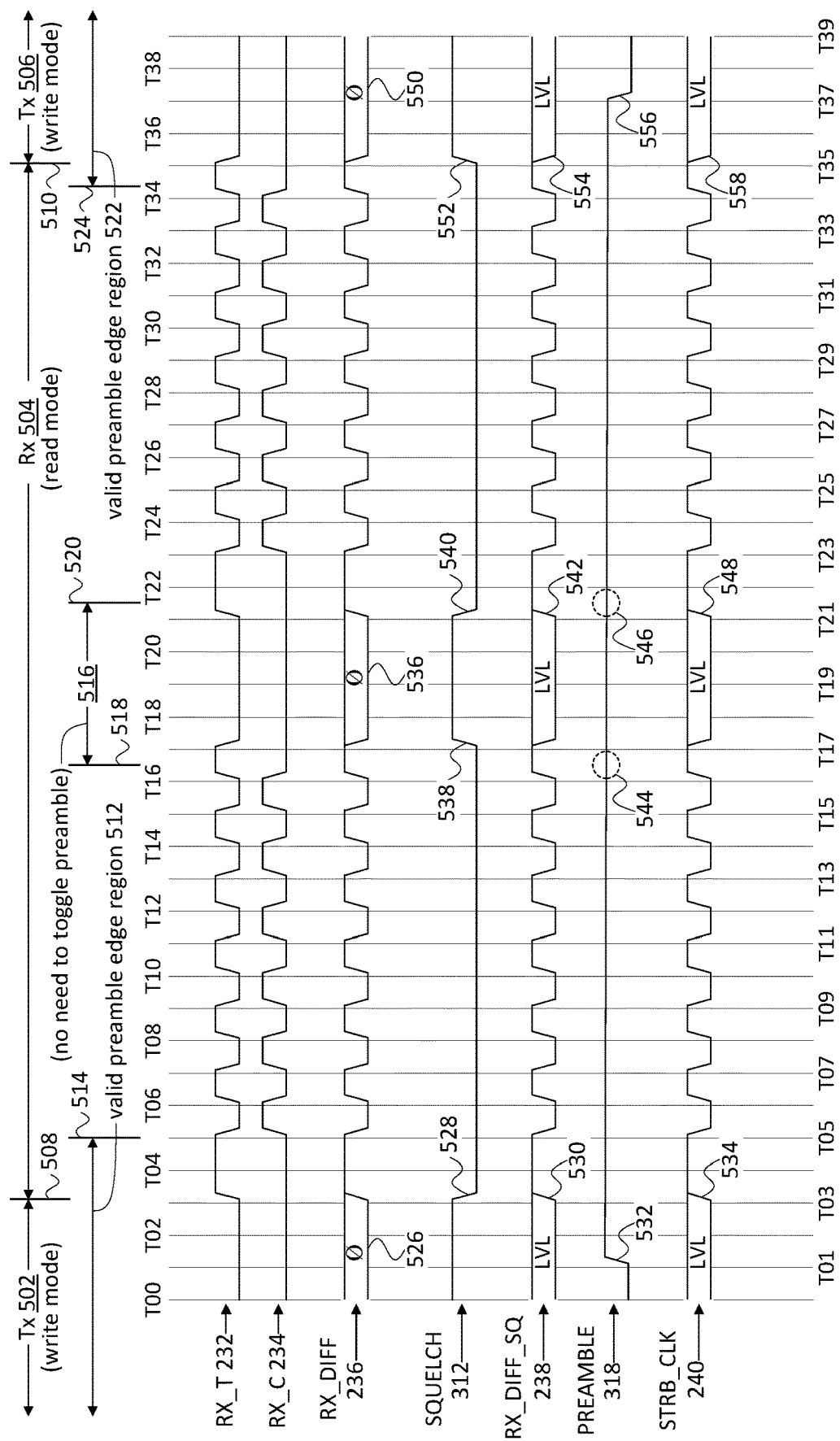
FIG. 5 is a second example timing diagram depicting example digital logic signals received and transmitted by various components that are depicted in the circuit diagram of FIG. 3 in accordance with some embodiments of the present disclosure.

FIG. 5 is a timing diagram 500 that is similar in a number of ways to the timing diagram 400 that is depicted in FIG. 4, and thus is not described in as great of detail Similar to the timing diagram 400, the timing diagram 500 is presented by way of illustration and example and not limitation, and does not include indication of any specific voltage levels or amounts of time. The 40 vertical lines in the timing diagram 500 are labeled T00-T39 and are similarly labeled with the even-numbered times at the top of the corresponding vertical lines and the odd-numbered times at the bottom of the corresponding vertical lines.

The overall time period that is depicted in the timing diagram 500 is divided as shown at the top into a write mode 502, a read mode 504, and a write mode 506. The write mode 502 has already begun prior to time T00, and ends at a time 508 that occurs at about the time T03. The read mode 504 spans from the time 508 through a time 510, which occurs at about the time T35. The write mode 506 starts at the time 510 and continues past the time T39. Similar to what is stated above with respect to the timing diagram 400, the times that are numbered in the 500 series can but need not align precisely with times that are labeled T00-T36.

One difference between the two timing diagrams is that the timing diagram 500 depicts two consecutive read bursts occurring during the single read mode 504, whereas the timing diagram 400 depicts only a single read burst during the read mode 404. The first of the two read bursts extends from about T06 to about T16, while the second extends from about T24 to about T33.

As is the case in the timing diagram 400, it can be seen in the timing diagram 500 that it is the behavior of the modified true strobe signal 232 and the modified complement strobe signal 234 that cause the behavior of the strobe difference signal 236, the squelch signal 312, and the modified strobe difference signal 238. As is also the case in the timing diagram 400, the preamble pulse 318 is independent of the behavior of any other signal in the timing diagram 500. Finally, the behavior of the strobe clock signal 240 is determined by a combination of the squelch signal 312 and the preamble pulse 318, where the squelch signal 312 is of course a function of the strobe difference signal 236, which itself is a function of the modified true strobe signal 232 and the modified complement strobe signal 234.

Similar to the timing diagram 400, in the timing diagram 500, the modified complement strobe signal 234 is generally—though not at all times—equal to the inverse of the modified true strobe signal 232, and the times during which both the modified true strobe signal 232 and the modified complement strobe signal 234 are low correspond with the strobe difference signal 236 being undefined. In particular, the strobe difference signal 236 is undefined during an undefined segment 526, an undefined segment 536, and an undefined segment 550. The squelch signal 312 is correspondingly only high at those same times: from a time prior to T00 until a falling edge 528, between a rising edge 538 and a falling edge 540, and from a rising edge 552 and extending past the time T39. The modified strobe difference signal 238 is accordingly equal to the constant strobe-level voltage 314 during those three times 530, 542, 554 and is otherwise equal to the strobe difference signal 236.

The preamble pulse 318 transitions from low to high at a rising edge 532 between the time T01 and the time T02, during the undefined segment 526 of the strobe difference signal 236. This occurs during a valid preamble edge region 512, which begins prior to the time T00 and ends at a time 514 (at about the time T05), at which point the strobe portion of the modified true strobe signal 232 and the modified complement strobe signal 234 begins. In prior implementations, the valid preamble edge region 512 would still end at T05 but would not start until the undefined segment 526 of the strobe difference signal 236 ends between the times T03 and T04.

Furthermore, a no-toggle time period 516 is indicated on the timing diagram 500. The no-toggle time period 516 extends from a time 518, which is between the time T16 and the time T17, to a time 520, which is between the time T21 and the time T22. This is a time period during which, due to implementations of the present disclosure, it is not necessary to toggle the preamble pulse 318 from high to low during a time segment 544 and then toggle the preamble pulse 318 back up from low to high during a time segment 546. In prior implementations, those toggling operations are necessary to avoid the undefined strobe difference signal 236 being passed through to the data-capture circuit 220.

Moreover, in prior implementations, achieving proper timing for those toggling operations requires that they occur during the time segment 544 and the time segment 546, which are narrow time windows. In implementations of the present disclosure, however, these toggling operations are not necessary, because the squelch signal 312 being high results in the modified strobe difference signal 238 being equal to the constant strobe-level voltage 314, which is passed through as the strobe clock signal 240 because the preamble pulse 318 is still high.

The preamble pulse 318 transitions from high to low at a falling edge 556, which occurs between the time T37 and the time T38, after the write mode 506 has already begun. This is during a valid preamble edge region 522, which starts at the time 524 between the time T34 and the time T35. In accordance with implementations of the present disclosure, the data-capture circuit 220 is already properly gated prior to the falling edge 556 by the squelch signal 312 going high at the rising edge 552 due to undefined status of the strobe difference signal 236 at that time, causing the modified strobe difference signal 238 to be set equal to the constant strobe-level voltage 314 by the squelch sub-circuit 224.

Even though the preamble pulse 318 is still high when this occurs, the undefined strobe difference signal 236 is not passed through to the data-capture circuit 220, as it would be in prior implementations while the preamble pulse 318 was still high. In prior implementations, the valid preamble edge region 522 would still begin at the time 524 but would end between the times T35 and T36 when the strobe difference signal 236 began the undefined segment 550. Thus, the valid preamble edge region 522 would last only about 2 UI in prior implementations whereas the valid preamble edge region 522 can extend into the write mode 506 in accordance with implementations of the present disclosure.

Finally, as is the case in the timing diagram 400, it can be seen in the timing diagram 500 that the strobe clock signal 240 is only equal to the strobe difference signal 236 at times 534, 548, 558 when it is both true that the strobe difference signal 236 is defined and the preamble pulse 318 is high. At all other times, the strobe clock signal 240 is equal to the constant strobe-level voltage 314, 320.

Figure 6:
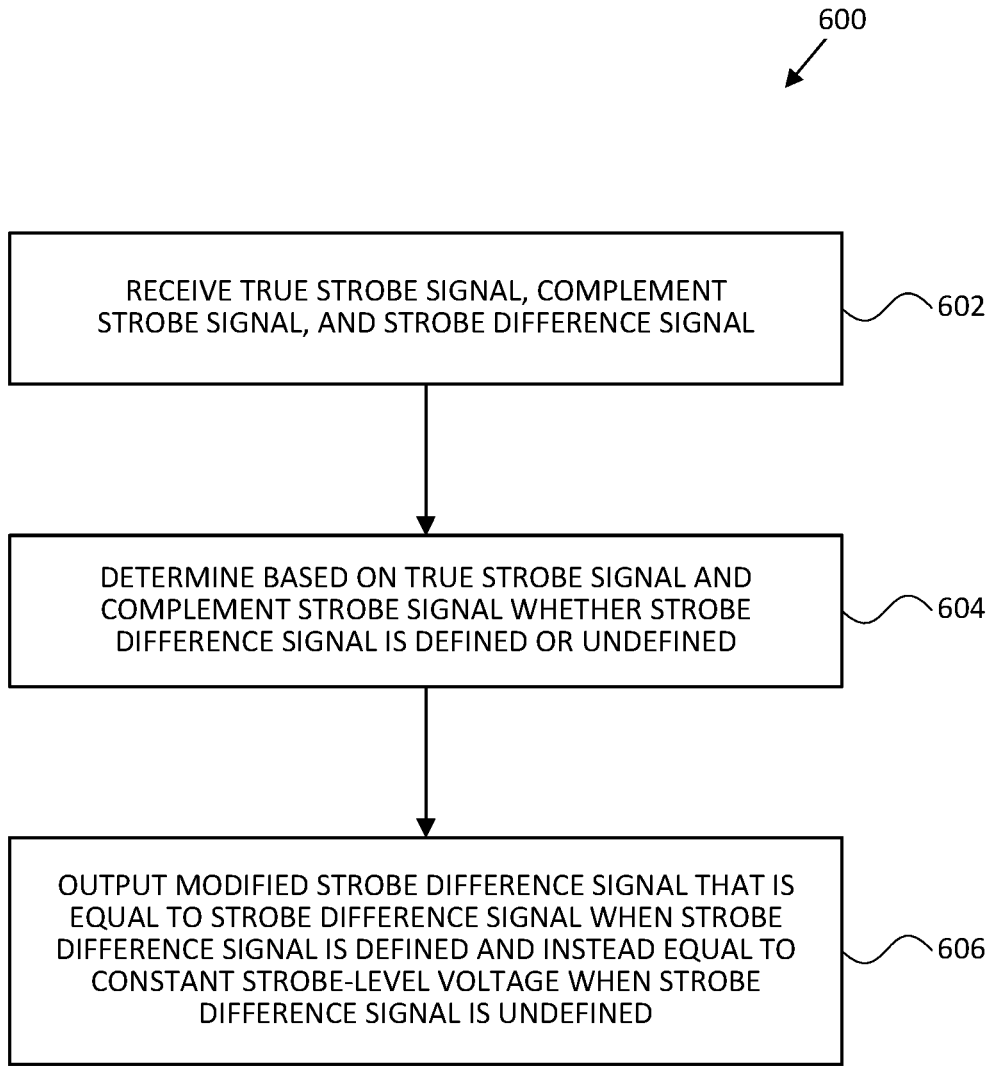
FIG. 6 is a flow diagram of a first example method for selectively squelching a differential strobe input signal in a memory-device testing system in accordance with some embodiments of the present disclosure.

FIG. 6 is a flow diagram of an example method 600 for selectively squelching a differential strobe input signal in a memory-device testing system. By way of example and not limitation, the method 600 is described below as being performed by the differential strobe input squelch circuit 221. In some instances, one or more operations are described as being performed by particular components of the differential strobe input squelch circuit 221.

Moreover, although shown in a particular sequence, unless otherwise specified, the order of the processes (e.g., operations) in either or both of the method 600 and the below-described method 900 can be modified. Thus, the illustrated implementations should be understood only as examples, and it should be understood with respect to each of the methods described herein that the illustrated processes can be performed in a different order, and that some processes can be performed in parallel. Additionally, one or more processes can be omitted in various embodiments. Thus, not all processes are performed in connection with every implementation. Other process flows are possible. Furthermore, either or both of the method 600 and the method 900 can be performed by processing logic that can include hardware (e.g., circuitry, dedicated logic, programmable logic, microcode, etc.), software (such as instructions executed on a processing device), firmware, or a combination thereof.

At operation 602, the squelch sub-circuit 224 receives the modified true strobe signal 232, the modified complement strobe signal 234, and the strobe difference signal 236. In at least one embodiment, the squelch sub-circuit 224 receives these signals from the tester strobe receiver circuit 301.

The squelch sub-circuit 224 determines (see operation 604), based on the modified true strobe signal 232 and the modified complement strobe signal 234, whether the strobe difference signal 236 is defined or undefined. In at least one embodiment, operation 604 involves the squelch sub-circuit 224 comparing the value of the modified true strobe signal 232 with the value of the modified complement strobe signal 234, determining that the strobe difference signal 236 is defined when the value of the modified true strobe signal 232 is not equal to the value of the modified complement strobe signal 234, and determining instead that the strobe difference signal 236 is undefined when the value of the modified true strobe signal 232 is equal to the value of the modified complement strobe signal 234.

In some embodiments, the differential strobe input squelch circuit 221 is of a ground-terminated I/O type, a logical NOR function is used to compare the value of the modified true strobe signal 232 with the value of the modified complement strobe signal 234, the strobe difference signal 236 is determined to be defined when the logical NOR function generates a logical false output based on the modified true strobe signal 232 and the modified complement strobe signal 234, and the strobe difference signal 236 is instead determined to be undefined when the logical NOR function generates a logical true output based on the modified true strobe signal 232 and the modified complement strobe signal 234.

In other embodiments, the differential strobe input squelch circuit 221 is of a supply-terminated I/O type, a logical AND function is used to compare the value of the modified true strobe signal 232 with the value of the modified complement strobe signal 234, the strobe difference signal 236 is determined to be defined when the logical AND function generates a logical false output based on the modified true strobe signal 232 and the modified complement strobe signal 234, and the strobe difference signal 236 is instead determined to be undefined when the logical AND function generates a logical true output based on the modified true strobe signal 232 and the modified complement strobe signal 234.

At operation 606, the squelch sub-circuit 224 outputs the modified strobe difference signal 238 that is equal to the strobe difference signal 236 when the strobe difference signal 236 is defined and that is instead equal to the constant strobe-level voltage 314 when the strobe difference signal 236 is undefined.

In at least one embodiment, the method 600 also includes the tester strobe receiver circuit 301 (i) receiving the differential strobe 208 from the DUT 202, where the differential strobe 208 includes the DUT true strobe signal 210 and the DUT complement strobe signal 212; (ii) generating the modified true strobe signal 232 as representative of a difference between the DUT true strobe signal 210 and $V_{REF}$, and outputting the modified true strobe signal 232 to the squelch sub-circuit 224; (iii) generating the modified complement strobe signal 234 as representative of a difference between the DUT complement strobe signal 212 and $V_{REF}$, and outputting the modified complement strobe signal 234 to the squelch sub-circuit 224; and (iv) generating the strobe difference signal 236 as representative of a difference between the DUT true strobe signal 210 and the DUT complement strobe signal 212, and outputting the strobe difference signal 236 to the squelch sub-circuit 224.

In at least one embodiment, the method 600 also includes the strobe-gate circuit 226 (i) receiving the preamble pulse 318, which is generated by the memory-device testing system 204; (ii) receiving the modified strobe difference signal 238 from the squelch sub-circuit 224; and (iii) outputting, to the data-capture circuit 220, the strobe clock signal 240 that is equal to the constant strobe-level voltage 320 when the preamble pulse 318 is in a first logical state (e.g., low) and that is instead equal to the modified strobe difference signal 238 when the preamble pulse 318 is in a second logical state (e.g., high). The method 600 can also include the data-capture circuit 220 receiving the single-ended read data signal 228 and using the strobe clock signal 240 to capture read data from the received single-ended data.

Figure 7:
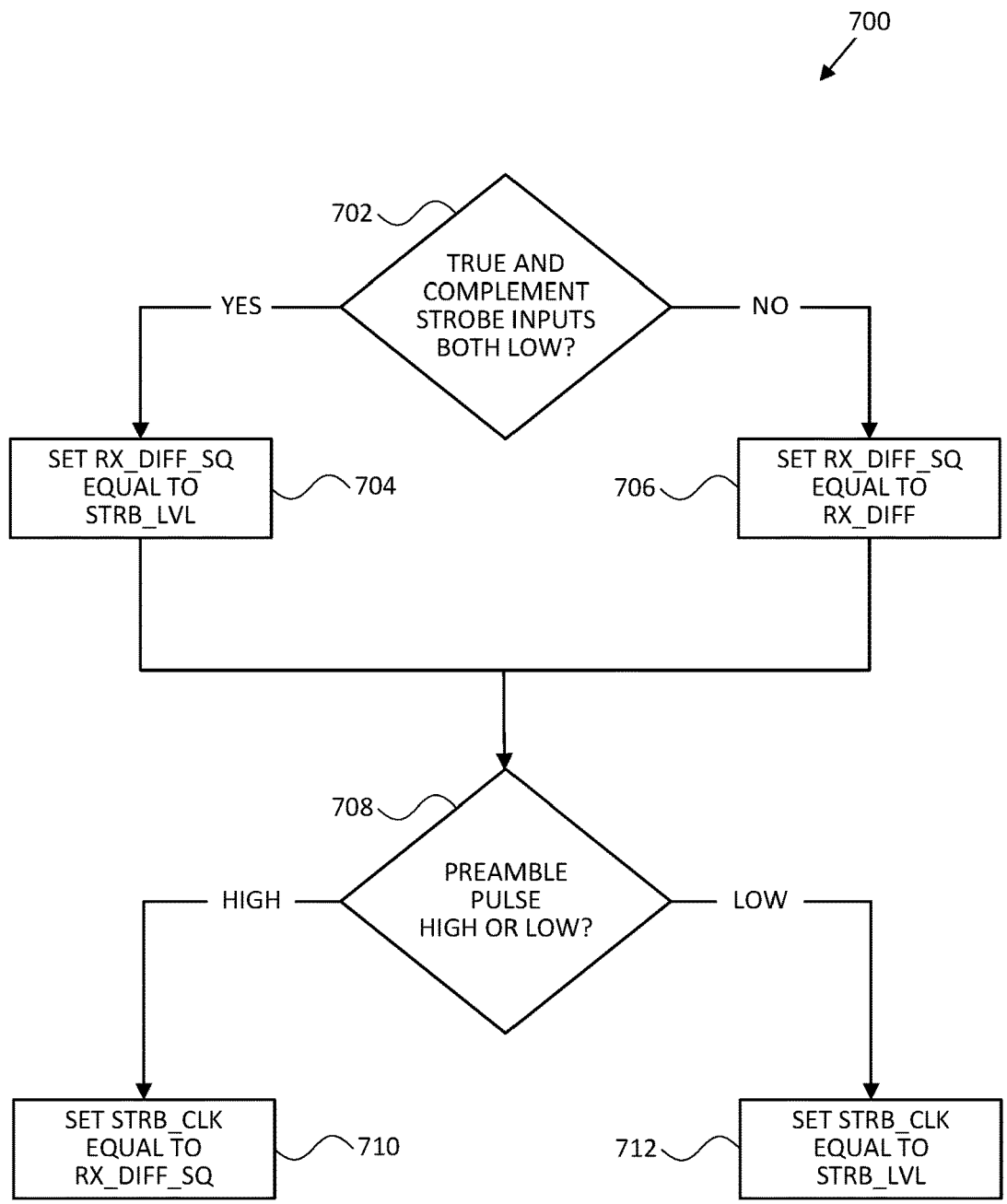
FIG. 7 is a flow diagram depicting some example operations performed by the memory-device testing system of FIG. 2 in accordance with some embodiments of the present disclosure.

FIG. 7 is a flow diagram 700 depicting some example operations performed by the memory-device testing system 204 in accordance with some embodiments of the present disclosure. In at least one embodiment, the operations depicted in the flow diagram 700 are performed by the differential strobe input squelch circuit 221. Where applicable, the various operations of the flow diagram 700 are described as being performed by particular components of the differential strobe input squelch circuit 221, though those instances are presented by way of example and not limitation.

At operation 702, the squelch sub-circuit 224 uses the NOR function 308 to determine whether the modified true strobe signal 232 and the modified complement strobe signal 234 are both low. If so, control proceeds to operation 704, where the squelch sub-circuit 224 sets the modified strobe difference signal 238 (identified in FIG. 7 as "RX_DIFF_SQ") equal to the constant strobe-level voltage 314 (identified in FIG. 7 as "STRB_LVL"). If not, control proceeds to operation 706, where the squelch sub-circuit 224 sets the modified strobe difference signal 238 (RX_DIFF_SQ) equal to the strobe difference signal 236 (identified in FIG. 7 as "RX_DIFF"). In either case, control proceeds next to operation 708.

At operation 708, the strobe-gate circuit 226 determines whether the preamble pulse 318 is high or low. If the preamble pulse 318 is high, control proceeds to operation 710, where the strobe-gate circuit 226 sets the strobe clock signal 240 (identified in FIG. 7 as "STRB_CLK") equal to the modified strobe difference signal 238 (RX_DIFF_SQ). If, instead, the preamble pulse 318 is low, control proceeds to operation 712, where the strobe-gate circuit 226 sets the strobe clock signal 240 (STRB_CLK) equal to the constant strobe-level voltage 320 (also identified in FIG. 7 as "STRB_LVL").

Figure 8:
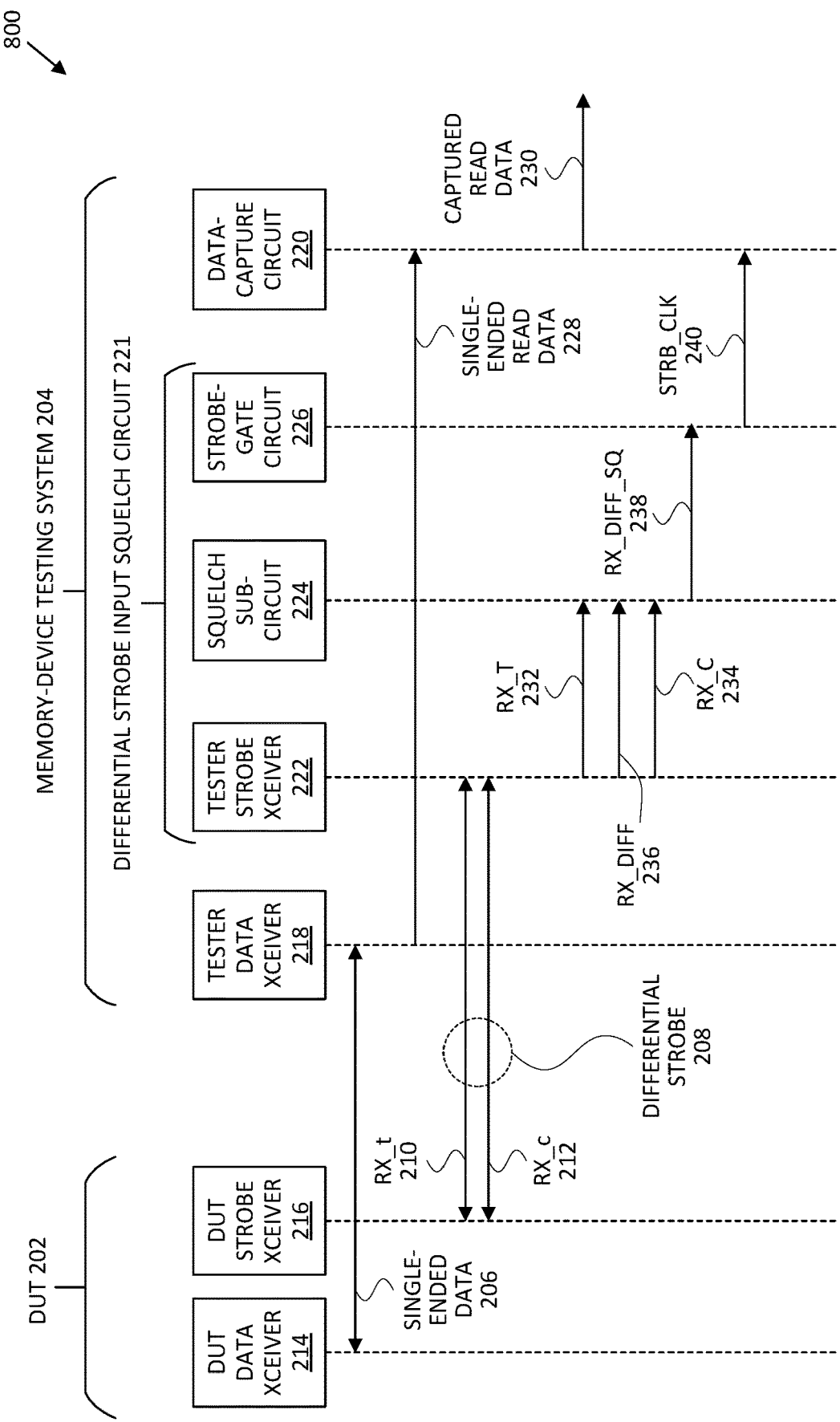
FIG. 8 is a message flow diagram depicting various signals that are exchanged among various components of the memory-device testing system of FIG. 2 in accordance with some embodiments of the present disclosure.

FIG. 8 is a message flow diagram 800 depicting various signals that are exchanged among various components of the memory-device testing system 204 in accordance with some embodiments of the present disclosure. Each of the depicted entities and signals are also described elsewhere in this disclosure, and thus are not described in detail in connection with the message flow diagram 800.

Briefly, it can be seen that the DUT 202 includes both the DUT data transceiver 214 and the DUT strobe transceiver 216, and that the memory-device testing system 204 includes the tester data transceiver 218, the differential strobe input squelch circuit 221, and the data-capture circuit 220. Furthermore, the differential strobe input squelch circuit 221 includes the tester strobe transceiver 222, the squelch sub-circuit 224, and the strobe-gate circuit 226.

The single-ended data signal 206 is exchanged between the DUT data transceiver 214 and the tester data transceiver 218, which passes the single-ended data signal 206 through to the data-capture circuit 220 as the single-ended read data signal 228. The differential strobe 208 is exchanged between the DUT strobe transceiver 216 and the tester strobe transceiver 222, and includes both the DUT true strobe signal 210 and the DUT complement strobe signal 212.

The tester strobe transceiver 222 receives the DUT true strobe signal 210 and the DUT complement strobe signal 212 from the DUT strobe transceiver 216, and outputs, to the squelch sub-circuit 224, the modified true strobe signal 232, the modified complement strobe signal 234, and the strobe difference signal 236. The squelch sub-circuit 224 receives those three signals and outputs the modified strobe difference signal 238 to the strobe-gate circuit 226. The strobe-gate circuit 226 receives the modified strobe difference signal 238 and outputs the strobe clock signal 240 to the data-capture circuit 220. Finally, the data-capture circuit 220 receives the single-ended read data signal 228 from the tester data transceiver 218 as well as the strobe clock signal 240 from the strobe-gate circuit 226, and, during read modes, uses the strobe clock signal 240 to extract the captured read data signal 230 from the single-ended read data signal 228.

Figure 9:
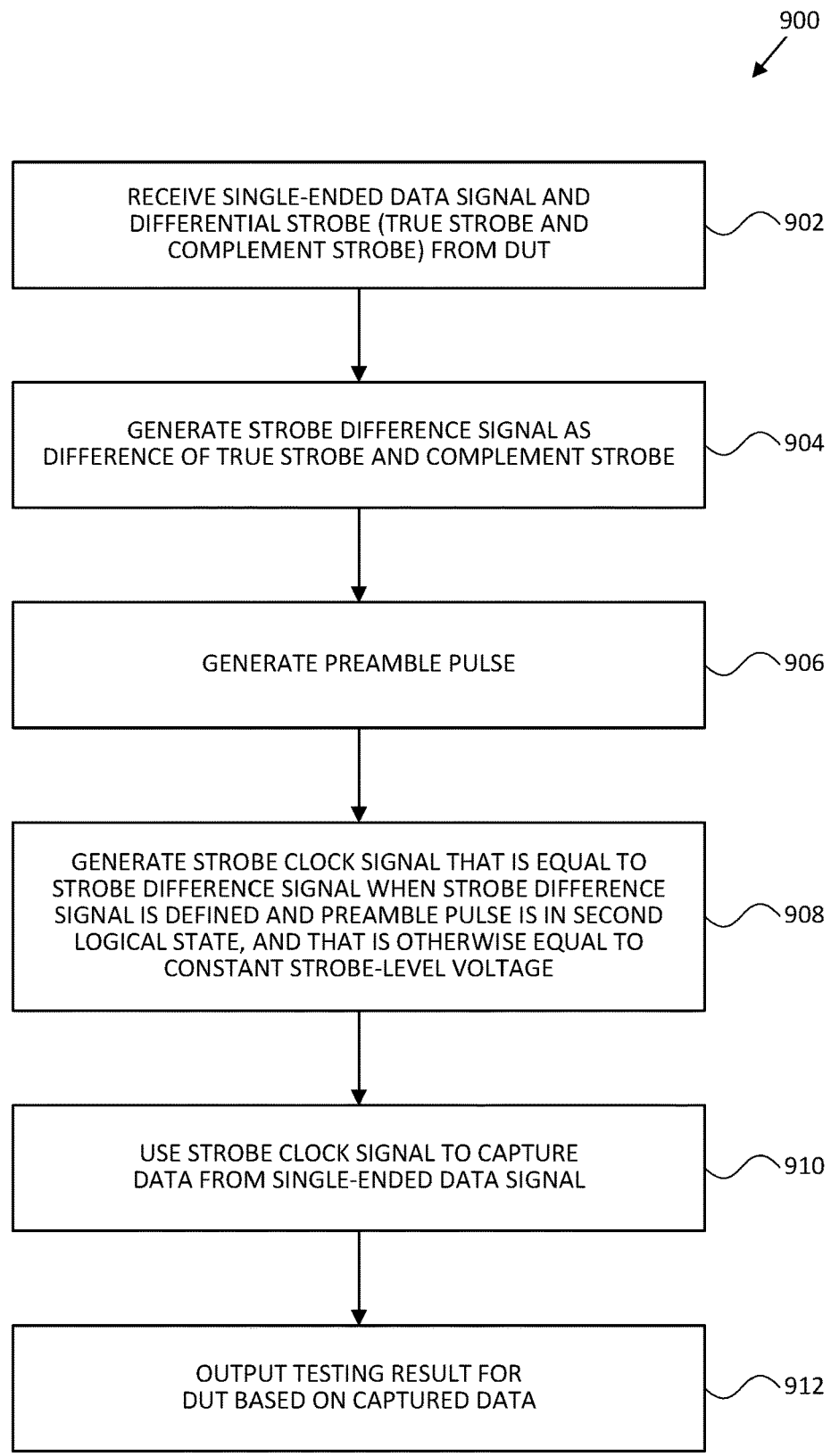
FIG. 9 is a flow diagram of a second example method for selectively squelching a differential strobe input signal in a memory-device testing system in accordance with some embodiments of the present disclosure.

FIG. 9 is a flow diagram of a method 900 for selectively squelching a differential strobe input signal in a memory-device testing system. By way of example and not limitation, the method 900 is described herein as being performed by the memory-device testing system 204. An embodiment takes the form of the memory-device testing system 204 configured to perform the method 900. Moreover, a number of the functions that are involved in the method 900 are described elsewhere in this disclosure and thus are not described in as great of detail here.

At operation 902, the memory-device testing system 204 receives the single-ended data signal 206 and the differential strobe 208 from the DUT 202. The differential strobe 208 includes the DUT true strobe signal 210 and the DUT complement strobe signal 212. In at least one embodiment, the DUT 202 is or includes an LPDDR memory device.

The memory-device testing system 204 generates (see operation 904), on the memory-device testing system 204, the strobe difference signal 236, which is representative of a difference between the DUT true strobe signal 210 and the DUT complement strobe signal 212. The memory-device testing system 204 also generates (see operation 906) the preamble pulse 318 from a free-running clock on the memory-device testing system 204. The preamble pulse 318 has a first logical state (e.g., low) and a second logical state (e.g., high).

At operation 908, the memory-device testing system 204 generates the strobe clock signal 240 on the memory-device testing system 204. The generated strobe clock signal 240 is equal to the strobe difference signal 236 when the strobe difference signal 236 is defined and the preamble pulse 318 is in the second logical state, and is otherwise equal to the constant strobe-level voltage 314, 320.

In at least one embodiment, the memory-device testing system 204 is configured to determine that the strobe difference signal 236 is defined when the value of the DUT true strobe signal 210 (as represented by the modified true strobe signal 232) is not equal to the value of the DUT complement strobe signal 212 (as represented by the modified complement strobe signal 234), and to instead determine that the strobe difference signal 236 is undefined when the value of the DUT true strobe signal 210 (as represented by the modified true strobe signal 232) is equal to the value of the DUT complement strobe signal 212 (as represented by the modified complement strobe signal 234). In at least one embodiment, the memory-device testing system 204 includes a logical NOR function (e.g., the NOR function 308) for making this determination.

At operation 910, the memory-device testing system 204 uses the strobe clock signal 240 to capture data from the single-ended data signal 206. In an embodiment, the memory-device testing system 204 does this by using the data-capture circuit 220 to extract the captured read data signal 230 from the single-ended read data signal 228, which in at least one embodiment is a passed-through copy of the single-ended data signal 206.

The memory-device testing system 204 thereafter outputs a testing result (see operation 912) for the DUT 202 based on the captured data (e.g., based on the captured read data signal 230). The testing result may be outputted to data storage, to a user interface such as a display, to a printer, to a locally connected device or computer, to a network-connected device or computer, and/or to any number of other destinations as deemed suitable for a given implementation. The testing result could indicate a simple pass or fail conclusion based on whether any data-read errors occurred during a certain test, whether at least a threshold number or percentage or fraction of data values included errors, whether a certain number of errors occurred, and/or any other suitable metric or metrics. In some instances, the testing result includes a number of errors that occurred during a given test, a percentage or fraction of read data values that included errors, and/or the like. The existence of data-read errors in given instances of data-read attempts could be determined using any suitable error-detection approaches such as cyclic redundancy check (CRC), checksum, and/or any others.

Figure 10:
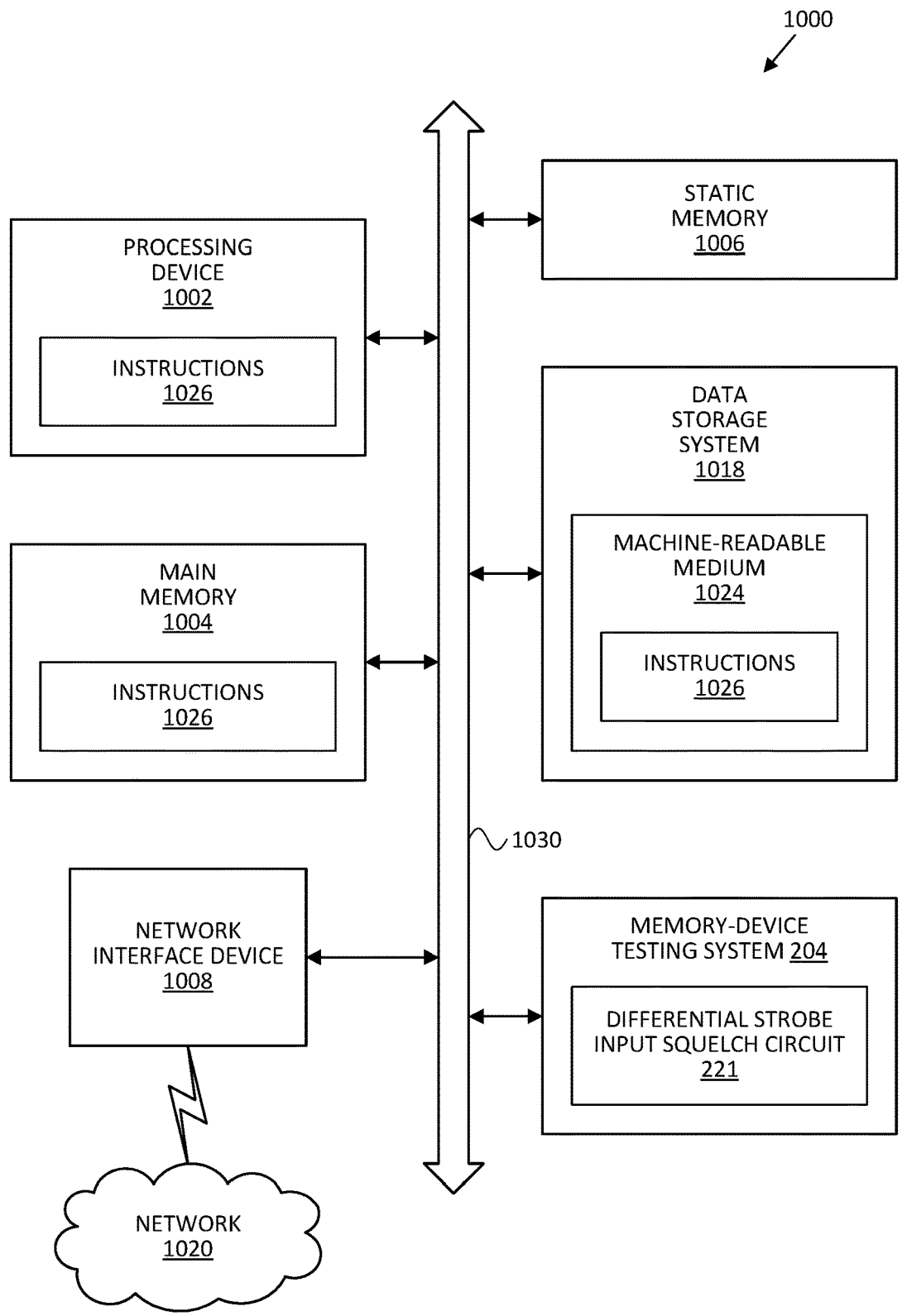
FIG. 10 is a block diagram of an example computer system in which embodiments of the present disclosure may operate.

FIG. 10 is a block diagram of an example computer system 1000 in which embodiments of the present disclosure may operate. In particular, FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the memory sub-system controller 115 of FIG. 1).

In some embodiments, the computer system 1000 can correspond to, include, and/or be coupled to a memory-device testing system (e.g., the memory-device testing system 204 of FIG. 2) and/or one or more components thereof (e.g., the squelch sub-circuit 224 of FIG. 2, the differential strobe input squelch circuit 221 of FIG. 2, and/or the like) and be configured to perform the methodologies discussed herein. In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., ROM, flash memory, DRAM such as SDRAM or RDRAM, etc.), a static memory 1006 (e.g., flash memory, SRAM, etc.), and a data storage system 1018, which communicate with each other via a bus 1030. The computer system 1000 also includes the memory-device testing system 204, which includes the differential strobe input squelch circuit 221, and which communicates with the other components of the computer system 1000 via the bus 1030.

The processing device 1002 represents one or more general-purpose processing devices such as a microprocessor, a central processing unit (CPU), or the like. More particularly, the processing device 1002 can be a complex instruction set computing (CISC) microprocessor, a reduced instruction set computing (RISC) microprocessor, a very long instruction word (VLIW) microprocessor, or a processor implementing other instruction sets, or processors implementing a combination of instruction sets. The processing device 1002 can also be one or more special-purpose processing devices such as an ASIC, an FPGA, a digital signal processor (DSP), a network processor, or the like. In at least one embodiment, the processing device 1002 is configured to execute instructions 1026 for performing the operations discussed herein. The computer system 1000 can further include a network interface device 1008 to communicate over a network 1020.

The data storage system 1018 can include a machine-readable storage medium 1024 (also known as a computer-readable medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, the data storage system 1018, and/or the main memory 1004 can correspond to the memory sub-system 110 of FIG. 1.

While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed description have been presented in terms of algorithms and symbolic representations of operations on data bits within a computer memory. These algorithmic descriptions and representations are the ways that are used by those skilled in the data-processing arts to most effectively convey the substance of their work to others skilled in such arts. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and/or otherwise manipulated. It has proven convenient at times, principally for reasons of common usage, to refer to these signals as bits, values, elements, symbols, characters, terms, numbers, and/or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within a computer system's registers and memories into other data similarly represented as physical quantities within the computer system's registers and memories or other such information-storage systems.

The present disclosure also relates to an apparatus for performing the operations that are described herein. This apparatus can be specially constructed for the intended purposes, or it can include a general-purpose computer selectively activated or reconfigured by a computer program stored in the computer. Such a computer program can be stored in a computer-readable storage medium such as but not limited to any type of disk including floppy disks, optical disks, CD-ROMs, magnetic-optical disks, ROMs, RAMs, EPROMs, EEPROMs, magnetic or optical cards, and/or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the present disclosure. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic device or devices) to perform a process according to the present disclosure. A machine-readable medium includes any mechanism for storing information in a form readable by a machine (e.g., a computer). In some implementations, a machine-readable (e.g., computer-readable) medium includes a machine-readable (e.g., computer-readable) storage medium such as a ROM, RAM, magnetic disk storage media, optical storage media, flash memory devices, and/or the like.

In this specification, some example implementations of the disclosure are described. It will be evident that various modifications can be made thereto without departing from the broader scope and spirit of the disclosure as set forth in the following claims. The specification and drawings are, accordingly, to be regarded in an illustrative sense rather than in a restrictive sense. Below is a non-exhaustive list of example implementations of the present disclosure.

Example 1 is a differential strobe input squelch circuit that includes a squelch sub-circuit configured to perform operations including: receiving a true strobe signal, a complement strobe signal, and a strobe difference signal that is representative of a difference between the true strobe signal and the complement strobe signal; determining, based on the true strobe signal and the complement strobe signal, whether the strobe difference signal is defined or undefined; and outputting a modified strobe difference signal that is equal to the strobe difference signal when the squelch sub-circuit determines that the strobe difference signal is defined and that is instead equal to a constant strobe-level voltage when the squelch sub-circuit determines that the strobe difference signal is undefined.

Example 2 is the differential strobe input squelch circuit of example 1, where determining, based on the true strobe signal and the complement strobe signal, whether the strobe difference signal is defined or undefined includes comparing the value of the true strobe signal with the value of the complement strobe signal; determining that the strobe difference signal is defined when the value of the true strobe signal is not equal to the value of the complement strobe signal; and determining that the strobe difference signal is undefined when the value of the true strobe signal is equal to the value of the complement strobe signal.

Example 3 is the differential strobe input squelch circuit of example 2, where the differential strobe input squelch circuit is of a ground-terminated I/O type; comparing the value of the true strobe signal with the value of the complement strobe signal includes using a logical NOR function to compare the value of the true strobe signal with the value of the complement strobe signal; determining that the strobe difference signal is defined when the value of the true strobe signal is not equal to the value of the complement strobe signal includes determining that the strobe difference signal is defined when the logical NOR function generates a logical false output based on the true strobe signal and the complement strobe signal; and determining that the strobe difference signal is undefined when the value of the true strobe signal is equal to the value of the complement strobe signal includes determining that the strobe difference signal is undefined when the logical NOR function generates a logical true output based on the true strobe signal and the complement strobe signal.

Example 4 is the differential strobe input squelch circuit of Example 2, where the differential strobe input squelch circuit is of a supply-terminated I/O type; comparing the value of the true strobe signal with the value of the complement strobe signal includes using a logical AND function to compare the value of the true strobe signal with the value of the complement strobe signal; determining that the strobe difference signal is defined when the value of the true strobe signal is not equal to the value of the complement strobe signal includes determining that the strobe difference signal is defined when the logical AND function generates a logical false output based on the true strobe signal and the complement strobe signal; and determining that the strobe difference signal is undefined when the value of the true strobe signal is equal to the value of the complement strobe signal includes determining that the strobe difference signal is undefined when the logical AND function generates a logical true output based on the true strobe signal and the complement strobe signal.

Example 5 is the differential strobe input squelch circuit of Example 1, further including a tester strobe receiver circuit configured to perform operations including: receiving a DUT differential strobe signal from a DUT, the DUT differential strobe signal including a DUT true strobe signal and a DUT complement strobe signal; generating the true strobe signal as representative of a difference between the DUT true strobe signal and a reference voltage, and outputting the generated true strobe signal to the squelch sub-circuit; generating the complement strobe signal as representative of a difference between the DUT complement strobe signal and the reference voltage, and outputting the generated complement strobe signal to the squelch sub-circuit; and generating the strobe difference signal as representative of a difference between the DUT true strobe signal and the DUT complement strobe signal, and outputting the generated strobe difference signal to the squelch sub-circuit.

Example 6 is the differential strobe input squelch circuit of Example 5, further including a strobe-gate circuit configured to perform operations including: receiving a preamble pulse signal generated by a tester system; receiving the modified strobe difference signal from the squelch sub-circuit; and outputting, to a data-capture circuit of the tester system, a strobe clock signal that is equal to the constant strobe-level voltage when the preamble pulse signal is in a first logical state and that is instead equal to the modified strobe difference signal when the preamble pulse signal is in a second logical state.

Example 7 is the differential strobe input squelch circuit of Example 6, where the tester system further includes a tester data transceiver that is configured to perform operations including: receiving single-ended data from the DUT and passing the received single-ended data to the data-capture circuit of the tester system; and the data-capture circuit of the tester system is configured to perform operations comprising using the strobe clock signal to capture read data from the received single-ended data.

Example 8 is the differential strobe input squelch circuit of Example 1, further including a strobe-gate circuit configured to perform operations including: receiving a preamble pulse signal generated by a tester system; receiving the modified strobe difference signal from the squelch sub-circuit; and outputting, to a data-capture circuit of the tester system, a strobe clock signal that is equal to the constant strobe-level voltage when the preamble pulse signal is in a first logical state and that is instead equal to the modified strobe difference signal when the preamble pulse signal is in a second logical state.

Example 9 is a method including: receiving, at a squelch sub-circuit of a differential strobe input squelch circuit, a true strobe signal, a complement strobe signal, and a strobe difference signal that is representative of a difference between the true strobe signal and the complement strobe signal; determining, by the squelch sub-circuit, and based on the true strobe signal and the complement strobe signal, whether the strobe difference signal is defined or undefined; and outputting, by the squelch sub-circuit, a modified strobe difference signal that is equal to the strobe difference signal when the strobe difference signal is defined and that is instead equal to a constant strobe-level voltage when the strobe difference signal is undefined.

Example 10 is the method of Example 9, where determining, based on the true strobe signal and the complement strobe signal, whether the strobe difference signal is defined or undefined includes comparing the value of the true strobe signal with the value of the complement strobe signal; determining that the strobe difference signal is defined when the value of the true strobe signal is not equal to the value of the complement strobe signal; and determining that the strobe difference signal is undefined when the value of the true strobe signal is equal to the value of the complement strobe signal.

Example 11 is the method of Example 10, where the differential strobe input squelch circuit is of a ground-terminated I/O type; comparing the value of the true strobe signal with the value of the complement strobe signal includes using a logical NOR function to compare the value of the true strobe signal with the value of the complement strobe signal; determining that the strobe difference signal is defined when the value of the true strobe signal is not equal to the value of the complement strobe signal includes determining that the strobe difference signal is defined when the logical NOR function generates a logical false output based on the true strobe signal and the complement strobe signal; and determining that the strobe difference signal is undefined when the value of the true strobe signal is equal to the value of the complement strobe signal includes determining that the strobe difference signal is undefined when the logical NOR function generates a logical true output based on the true strobe signal and the complement strobe signal.

Example 12 is the method of Example 10, where the differential strobe input squelch circuit is of a supply-terminated I/O type; comparing the value of the true strobe signal with the value of the complement strobe signal includes using a logical AND function to compare the value of the true strobe signal with the value of the complement strobe signal; determining that the strobe difference signal is defined when the value of the true strobe signal is not equal to the value of the complement strobe signal includes determining that the strobe difference signal is defined when the logical AND function generates a logical false output based on the true strobe signal and the complement strobe signal; and determining that the strobe difference signal is undefined when the value of the true strobe signal is equal to the value of the complement strobe signal includes determining that the strobe difference signal is undefined when the logical AND function generates a logical true output based on the true strobe signal and the complement strobe signal.

Example 13 is the method of Example 9, further including: receiving, at a tester strobe receiver circuit of the differential strobe input squelch circuit, a DUT differential strobe signal from a DUT, the DUT differential strobe signal including a DUT true strobe signal and a DUT complement strobe signal; generating, by the tester strobe receiver circuit, the true strobe signal as representative of a difference between the DUT true strobe signal and a reference voltage, the tester strobe receiver circuit outputting the generated true strobe signal to the squelch sub-circuit; generating, by the tester strobe receiver circuit, the complement strobe signal as representative of a difference between the DUT complement strobe signal and the reference voltage, the tester strobe receiver circuit outputting the generated complement strobe signal to the squelch sub-circuit; and generating, by the tester strobe receiver circuit, the strobe difference signal as representative of a difference between the DUT true strobe signal and the DUT complement strobe signal, the tester strobe receiver circuit outputting the generated strobe difference signal to the squelch sub-circuit.

Example 14 is the method of Example 13, further including: receiving, at a strobe-gate circuit of the differential strobe input squelch circuit, a preamble pulse signal generated by a tester system; receiving, at the strobe-gate circuit, the modified strobe difference signal from the squelch sub-circuit; and outputting, by the strobe-gate circuit, and to a data-capture circuit of the tester system, a strobe clock signal that is equal to the constant strobe-level voltage when the preamble pulse signal is in a first logical state and that is instead equal to the modified strobe difference signal when the preamble pulse signal is in a second logical state.

Example 15 is the method of Example 14, further including: receiving, at the data-capture circuit, single-ended data from the DUT; and using, by the data-capture circuit, the strobe clock signal to capture read data from the received single-ended data.

Example 16 is the method of Example 9, further including: receiving, at a strobe-gate circuit of the differential strobe input squelch circuit, a preamble pulse signal generated by a tester system; receiving, at the strobe-gate circuit, the modified strobe difference signal from the squelch sub-circuit; and outputting, by the strobe-gate circuit, and to a data-capture circuit of the tester system, a strobe clock signal that is equal to the constant strobe-level voltage when the preamble pulse signal is in a first logical state and that is instead equal to the modified strobe difference signal when the preamble pulse signal is in a second logical state.

Example 17 is a memory-device testing system configured to perform operations including: receiving a single-ended data signal and a differential strobe from a DUT, the differential strobe including a true strobe signal and a complement strobe signal; generating a strobe difference signal that is representative of a difference between the true strobe signal and the complement strobe signal; generating, from a free-running clock of the memory-device testing system, a preamble pulse signal having a first logical state and a second logical state; generating, on the memory-device testing system, a strobe clock signal that is equal to the strobe difference signal when the strobe difference signal is defined and the preamble pulse signal is in the second logical state, and that is otherwise equal to a constant strobe-level voltage; using the generated strobe clock signal to capture data from the single-ended data signal; and outputting a testing result for the DUT based on the captured data.

Example 18 is the memory-device testing system of Example 17, where the DUT includes an LPDDR memory device.

Example 19 is the memory-device testing system of Example 17, further configured to perform operations including: determining that the strobe difference signal is defined when the value of the true strobe signal is not equal to the value of the complement strobe signal; and determining that the strobe difference signal is undefined when the value of the true strobe signal is equal to the value of the complement strobe signal.

Example 20 is the memory-device testing system of Example 19, further configured to perform operations including using a logical NOR function to determine whether the value of the true strobe signal is or is not equal to the value of the complement strobe signal.

What is claimed is:

1. A differential strobe input squelch circuit comprising a squelch sub-circuit configured to perform operations comprising:
   receiving a true strobe signal, a complement strobe signal, and a strobe difference signal that is representative of a difference between the true strobe signal and the complement strobe signal;
   determining, based on the true strobe signal and the complement strobe signal, whether the strobe difference signal is defined or undefined; and
   outputting a modified strobe difference signal that is equal to the strobe difference signal when the squelch sub-circuit determines that the strobe difference signal is defined and that is instead equal to a constant strobe-level voltage when the squelch sub-circuit determines that the strobe difference signal is undefined.

2. The differential strobe input squelch circuit of claim 1, wherein determining, based on the true strobe signal and the complement strobe signal, whether the strobe difference signal is defined or undefined comprises:
   comparing the value of the true strobe signal with the value of the complement strobe signal;
   determining that the strobe difference signal is defined when the value of the true strobe signal is not equal to the value of the complement strobe signal; and
   determining that the strobe difference signal is undefined when the value of the true strobe signal is equal to the value of the complement strobe signal.

3. The differential strobe input squelch circuit of claim 2, wherein:
   the differential strobe input squelch circuit is of a ground-terminated input/output (I/O) type;
   comparing the value of the true strobe signal with the value of the complement strobe signal comprises using a logical NOR function to compare the value of the true strobe signal with the value of the complement strobe signal;
   determining that the strobe difference signal is defined when the value of the true strobe signal is not equal to the value of the complement strobe signal comprises determining that the strobe difference signal is defined when the logical NOR function generates a logical false output based on the true strobe signal and the complement strobe signal; and
   determining that the strobe difference signal is undefined when the value of the true strobe signal is equal to the value of the complement strobe signal comprises determining that the strobe difference signal is undefined when the logical NOR function generates a logical true output based on the true strobe signal and the complement strobe signal.

4. The differential strobe input squelch circuit of claim 2, wherein:
   the differential strobe input squelch circuit is of a supply-terminated input/output (I/O) type;
   comparing the value of the true strobe signal with the value of the complement strobe signal comprises using a logical AND function to compare the value of the true strobe signal with the value of the complement strobe signal;
   determining that the strobe difference signal is defined when the value of the true strobe signal is not equal to the value of the complement strobe signal comprises determining that the strobe difference signal is defined when the logical AND function generates a logical false output based on the true strobe signal and the complement strobe signal; and
   determining that the strobe difference signal is undefined when the value of the true strobe signal is equal to the value of the complement strobe signal comprises determining that the strobe difference signal is undefined when the logical AND function generates a logical true output based on the true strobe signal and the complement strobe signal.

5. The differential strobe input squelch circuit of claim 1, further comprising a tester strobe receiver circuit configured to perform operations comprising:
   receiving a device-under-test (DUT) differential strobe signal from a DUT, the DUT differential strobe signal comprising a DUT true strobe signal and a DUT complement strobe signal;
   generating the true strobe signal as representative of a difference between the DUT true strobe signal and a reference voltage, and outputting the generated true strobe signal to the squelch sub-circuit;
   generating the complement strobe signal as representative of a difference between the DUT complement strobe signal and the reference voltage, and outputting the generated complement strobe signal to the squelch sub-circuit; and
   generating the strobe difference signal as representative of a difference between the DUT true strobe signal and the DUT complement strobe signal, and outputting the generated strobe difference signal to the squelch sub-circuit.

6. The differential strobe input squelch circuit of claim 5, further comprising a strobe-gate circuit configured to perform operations comprising:
   receiving a preamble pulse signal generated by a tester system;
   receiving the modified strobe difference signal from the squelch sub-circuit; and
   outputting, to a data-capture circuit of the tester system, a strobe clock signal that is equal to the constant strobe-level voltage when the preamble pulse signal is in a first logical state and that is instead equal to the modified strobe difference signal when the preamble pulse signal is in a second logical state.

7. The differential strobe input squelch circuit of claim 6, wherein:
   the tester system further comprises a tester data transceiver that is configured to perform operations comprising:
      receiving single-ended data from the DUT; and
      passing the received single-ended data to the data-capture circuit of the tester system; and
   the data-capture circuit of the tester system is further configured to perform operations comprising:
      using the strobe clock signal to capture read data from the received single-ended data.

8. The differential strobe input squelch circuit of claim 1, further comprising a strobe-gate circuit configured to perform operations comprising:

receiving a preamble pulse signal generated by a tester system;
receiving the modified strobe difference signal from the squelch sub-circuit; and
outputting, to a data-capture circuit of the tester system, a strobe clock signal that is equal to the constant strobe-level voltage when the preamble pulse signal is in a first logical state and that is instead equal to the modified strobe difference signal when the preamble pulse signal is in a second logical state.

9. A method comprising:
receiving, at a squelch sub-circuit of a differential strobe input squelch circuit, a true strobe signal, a complement strobe signal, and a strobe difference signal that is representative of a difference between the true strobe signal and the complement strobe signal;
determining, by the squelch sub-circuit, and based on the true strobe signal and the complement strobe signal, whether the strobe difference signal is defined or undefined; and
outputting, by the squelch sub-circuit, a modified strobe difference signal that is equal to the strobe difference signal when the strobe difference signal is defined and that is instead equal to a constant strobe-level voltage when the strobe difference signal is undefined.

10. The method of claim 9, wherein determining, based on the true strobe signal and the complement strobe signal, whether the strobe difference signal is defined or undefined comprises:
comparing the value of the true strobe signal with the value of the complement strobe signal;
determining that the strobe difference signal is defined when the value of the true strobe signal is not equal to the value of the complement strobe signal; and
determining that the strobe difference signal is undefined when the value of the true strobe signal is equal to the value of the complement strobe signal.

11. The method of claim 10, wherein
the differential strobe input squelch circuit is of a ground-terminated input/output (I/O) type;
comparing the value of the true strobe signal with the value of the complement strobe signal comprises using a logical NOR function to compare the value of the true strobe signal with the value of the complement strobe signal;
determining that the strobe difference signal is defined when the value of the true strobe signal is not equal to the value of the complement strobe signal comprises determining that the strobe difference signal is defined when the logical NOR function generates a logical false output based on the true strobe signal and the complement strobe signal; and
determining that the strobe difference signal is undefined when the value of the true strobe signal is equal to the value of the complement strobe signal comprises determining that the strobe difference signal is undefined when the logical NOR function generates a logical true output based on the true strobe signal and the complement strobe signal.

12. The method of claim 10, wherein:
the differential strobe input squelch circuit is of a supply-terminated input/output (I/O) type;
comparing the value of the true strobe signal with the value of the complement strobe signal comprises using a logical AND function to compare the value of the true strobe signal with the value of the complement strobe signal;
determining that the strobe difference signal is defined when the value of the true strobe signal is not equal to the value of the complement strobe signal comprises determining that the strobe difference signal is defined when the logical AND function generates a logical false output based on the true strobe signal and the complement strobe signal; and
determining that the strobe difference signal is undefined when the value of the true strobe signal is equal to the value of the complement strobe signal comprises determining that the strobe difference signal is undefined when the logical AND function generates a logical true output based on the true strobe signal and the complement strobe signal.

13. The method of claim 9, further comprising:
receiving, at a tester strobe receiver circuit of the differential strobe input squelch circuit, a device-under-test (DUT) differential strobe signal from a DUT, the DUT differential strobe signal comprising a DUT true strobe signal and a DUT complement strobe signal;
generating, by the tester strobe receiver circuit, the true strobe signal as representative of a difference between the DUT true strobe signal and a reference voltage, the tester strobe receiver circuit outputting the generated true strobe signal to the squelch sub-circuit;
generating, by the tester strobe receiver circuit, the complement strobe signal as representative of a difference between the DUT complement strobe signal and the reference voltage, the tester strobe receiver circuit outputting the generated complement strobe signal to the squelch sub-circuit; and
generating, by the tester strobe receiver circuit, the strobe difference signal as representative of a difference between the DUT true strobe signal and the DUT complement strobe signal, the tester strobe receiver circuit outputting the generated strobe difference signal to the squelch sub-circuit.

14. The method of claim 13, further comprising:
receiving, at a strobe-gate circuit of the differential strobe input squelch circuit, a preamble pulse signal generated by a tester system;
receiving, at the strobe-gate circuit, the modified strobe difference signal from the squelch sub-circuit; and
outputting, by the strobe-gate circuit, and to a data-capture circuit of the tester system, a strobe clock signal that is equal to the constant strobe-level voltage when the preamble pulse signal is in a first logical state and that is instead equal to the modified strobe difference signal when the preamble pulse signal is in a second logical state.

15. The method of claim 14, further comprising:
receiving, at the data-capture circuit, single-ended data from the DUT; and
using, by the data-capture circuit, the strobe clock signal to capture read data from the received single-ended data.

16. The method of claim 9, further comprising:
receiving, at a strobe-gate circuit of the differential strobe input squelch circuit, a preamble pulse signal generated by a tester system;
receiving, at the strobe-gate circuit, the modified strobe difference signal from the squelch sub-circuit; and
outputting, by the strobe-gate circuit, and to a data-capture circuit of the tester system, a strobe clock signal that is equal to the constant strobe-level voltage when the preamble pulse signal is in a first logical state and that is instead equal to the modified strobe difference signal when the preamble pulse signal is in a second logical state.

17. A memory-device testing system configured to perform operations comprising:
- receiving a single-ended data signal and a differential strobe from a device under test (DUT), the differential strobe comprising a true strobe signal and a complement strobe signal;
- generating a strobe difference signal that is representative of a difference between the true strobe signal and the complement strobe signal;
- generating, from a free-running clock of the memory-device testing system, a preamble pulse signal having a first logical state and a second logical state;
- generating, on the memory-device testing system, a strobe clock signal that is equal to the strobe difference signal when the strobe difference signal is defined and the preamble pulse signal is in the second logical state, and that is otherwise equal to a constant strobe-level voltage;
- using the generated strobe clock signal to capture data from the single-ended data signal; and
- outputting a testing result for the DUT based on the captured data.

18. The memory-device testing system of claim 17, wherein the DUT comprises a low-power double data rate (LPDDR) memory device.

19. The memory-device testing system of claim 17, further configured to perform operations comprising:
- determining that the strobe difference signal is defined when the value of the true strobe signal is not equal to the value of the complement strobe signal; and
- determining that the strobe difference signal is undefined when the value of the true strobe signal is equal to the value of the complement strobe signal.

20. The memory-device testing system of claim 19, further configured to perform operations comprising:
- using a logical NOR function to determine whether the value of the true strobe signal is or is not equal to the value of the complement strobe signal.

* * * * *